(12) United States Patent
Luo et al.

(10) Patent No.: US 11,864,426 B2
(45) Date of Patent: Jan. 2, 2024

(54) OLED WITH PHOTOSPACERS HAVING PROTRUSIONS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Chang Luo, Beijing (CN); Fengli Ji, Beijing (CN); Jianpeng Wu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 536 days.

(21) Appl. No.: 16/767,658

(22) PCT Filed: May 14, 2019

(86) PCT No.: PCT/CN2019/086858
§ 371 (c)(1),
(2) Date: May 28, 2020

(87) PCT Pub. No.: WO2020/227930
PCT Pub. Date: Nov. 19, 2020

(65) Prior Publication Data
US 2021/0408181 A1    Dec. 30, 2021

(51) Int. Cl.
*H01L 27/32*    (2006.01)
*H01L 51/00*    (2006.01)
(Continued)

(52) U.S. Cl.
CPC .......... *H10K 59/122* (2023.02); *H10K 71/00* (2023.02); *H10K 71/164* (2023.02); *H10K 71/166* (2023.02); *H10K 59/1201* (2023.02)

(58) Field of Classification Search
CPC .............. H01L 27/3246; H01L 51/001; H01L 51/0011; H01L 51/56; H01L 2227/323; H01L 51/525
See application file for complete search history.

(56) References Cited

U.S. PATENT DOCUMENTS 10,741,622 B2    8/2020    Zhu
10,770,525 B2    9/2020    Jiang et al.
(Continued)

FOREIGN PATENT DOCUMENTS

| CN | 107104130 A | 8/2017 |
| CN | 108231824 A | 6/2018 |

(Continued)

*Primary Examiner* — Peter Bradford
(74) *Attorney, Agent, or Firm* — Dilworth & Barrese, LLP.; Michael J. Musella, Esq.

(57) ABSTRACT

An array substrate, a manufacturing method thereof, and a display device are provided. The array substrate includes: a base substrate; a light-emitting functional layer including a first light-emitting functional portion and a second light-emitting functional portion adjacent to each other; and a photo spacer (PS), the PS is located between the first light-emitting functional portion and the second light-emitting functional portion, the PS includes a plurality of protrusions protruded in a direction away from the base substrate and a first recess located between adjacent protrusions.

17 Claims, 14 Drawing Sheets

(51) Int. Cl.
  *H01L 51/56* (2006.01)
  *H10K 59/122* (2023.01)
  *H10K 71/00* (2023.01)
  *H10K 71/16* (2023.01)
  *H10K 59/12* (2023.01)

(56) References Cited

U.S. PATENT DOCUMENTS

| | | | | |
|---|---|---|---|---|
| 2014/0319484 A1* | 10/2014 | Kwon | ................... | H01L 27/326 |
| | | | | 257/40 |
| 2016/0148981 A1* | 5/2016 | Matsueda | ........... | H01L 27/3218 |
| | | | | 257/40 |
| 2016/0254476 A1* | 9/2016 | Park | ................... | H01L 27/3216 |
| | | | | 257/40 |
| 2017/0179420 A1 | 6/2017 | Lee et al. | | |
| 2018/0342563 A1 | 11/2018 | You et al. | | |
| 2019/0131528 A1 | 5/2019 | Donoghue et al. | | |
| 2020/0279898 A1 | 9/2020 | Duan | | |

FOREIGN PATENT DOCUMENTS

| | | | | |
|---|---|---|---|---|
| CN | 207966996 U | | 10/2018 | |
| CN | 109148522 A | | 1/2019 | |
| CN | 109166883 A | | 1/2019 | |
| CN | 109378329 A | | 2/2019 | |
| JP | 2016100339 A | * | 5/2016 | |
| KR | 20170041370 A | * | 4/2017 | |

\* cited by examiner

OLED WITH PHOTOSPACERS HAVING PROTRUSIONS

TECHNICAL FIELD

Embodiments of the present disclosure relate to an array substrate, a manufacturing method thereof, and a display device.

BACKGROUND

At present, the manufacture of organic light-emitting diode (OLED) display panels mainly adopts an evaporation method. During an evaporation process, a fine metal mask (FMM) is utilized to form a light-emitting functional layer of a sub-pixel such as R/G/B sub-pixel, so that a material is evaporated at a preset position.

SUMMARY

At least one embodiment of the present disclosure provides an array substrate, a manufacturing method thereof, and a display device.

At least one embodiment of the present disclosure provides an array substrate, including: a base substrate; a light-emitting functional layer, the light-emitting functional layer including a plurality of light-emitting functional portions, the plurality of light-emitting functional portions including a first light-emitting functional portion and a second light-emitting functional portion adjacent to each other; and a photo spacer (PS), the PS being located between the first light-emitting functional portion and the second light-emitting functional portion, the PS including a plurality of protrusions protruded in a direction away from the base substrate and a first recess located between adjacent protrusions.

According to the array substrate provided by one or more embodiments of the present disclosure, one of the adjacent protrusions is configured to support a first rib of a first fine metal mask (FMM) enclosing a first through hole, in fabricating the first light-emitting functional portion, so that an orthographic projection of a portion of a first ridged edge on the base substrate falls within an orthographic projection of the first recess on the base substrate, wherein the first ridged edge is formed by a first side surface of the first rib intersecting with a first surface of the first rib, the first side surface encloses the first through hole, and the first surface contacts the PS; the other one of the adjacent protrusions is configured to support a second rib of a second FMM enclosing a second through hole, in fabricating the second light-emitting functional portion, so that an orthographic projection of a portion of a second ridged edge on the base substrate falls within the orthographic projection of the first recess on the base substrate, wherein the second ridged edge is formed by a second side surface of the second rib intersecting with a second surface of the second rib, the second side surface encloses the second through hole, and the second surface contacts the PS.

According to the array substrate provided by one or more embodiments of the present disclosure, an orthographic projection of a portion of the first side surface close to the first ridged edge on the base substrate falls within the orthographic projection of the first recess on the base substrate.

According to the array substrate provided by one or more embodiments of the present disclosure, the PS further includes a base portion, the plurality of protrusions are located at a side of the base portion away from the base substrate, and the plurality of protrusions and the base portion are formed as an integral structure.

According to the array substrate provided by one or more embodiments of the present disclosure, orthographic projections of the plurality of protrusions on the base substrate fall within an orthographic projection of the base portion on the base substrate.

According to the array substrate provided by one or more embodiments of the present disclosure, the plurality of protrusions are located on an edge part of the base portion, at a side of the base portion away from the base substrate.

According to the array substrate provided by one or more embodiments of the present disclosure, each of the plurality of protrusions includes a plurality of sub-protrusions, a second recess is provided between adjacent sub-protrusions, and a size of the second recess in a direction parallel with the base substrate is smaller than or equal to a size of the first recess in the direction parallel with the base substrate.

According to the array substrate provided by one or more embodiments of the present disclosure, the PS has a strip shape, a length of each of the plurality of protrusions is smaller than or equal to a size of a surface of the PS away from the base substrate in a direction of long side of the PS, and the first recess extends between the adjacent protrusions along the direction of long side of the PS.

According to the array substrate provided by one or more embodiments of the present disclosure, the PS includes two strip-shaped protrusions, the two strip-shaped protrusions extend along an extension direction of the first light-emitting functional portion or the second light-emitting functional portion.

According to the array substrate provided by one or more embodiments of the present disclosure, the PS includes three protrusions, the three protrusions are located on three edges of a triangle, respectively, and the first recess is provided between every two protrusions of the three protrusions.

According to the array substrate provided by one or more embodiments of the present disclosure, the plurality of light-emitting functional portions further include a third light-emitting functional portion; and the first light-emitting functional portion, the second light-emitting functional portion and the third light-emitting functional portion belong to sub-pixels emitting light of different colors, respectively; the first light-emitting functional portion, the second light-emitting functional portion and the third light-emitting functional portion are arranged sequentially; or, every two of the first light-emitting functional portion, the second light-emitting functional portion and the third light-emitting functional portion are adjacent to each other.

According to the array substrate provided by one or more embodiments of the present disclosure, the PS has a strip shape, the PS includes four protrusions, the four protrusions are located on two sides of the PS, respectively, the two sides of the PS are opposite to each other, and each of the two sides of the PS is provided with two protrusions arranged along an extension direction of the side.

According to the array substrate provided by one or more embodiments of the present disclosure, the PS has a strip shape, the PS includes four protrusions, the four protrusions are located on four sides of the PS, respectively, and each of the four sides of the PS is provided with one protrusion arranged along an extension direction of the side.

According to the array substrate provided by one or more embodiments of the present disclosure, the light-emitting functional layer further includes a third light-emitting functional portion; and the first light-emitting functional portion, the second light-emitting functional portion and the third light-emitting functional portion belong to sub-pixels emitting light of different colors, respectively; the light-emitting functional layer is provided with two first light-emitting functional portions, the two first light-emitting functional portions are arranged sequentially; the second light-emitting functional portion and the third light-emitting functional portion are located at two sides of a connecting line of centers of the two first light-emitting functional portions, respectively; every two of the two first light-emitting functional portions, the second light-emitting functional portion, and the third light-emitting functional portion are adjacent to each other; the PS is located between the two first light-emitting functional portions, and is located between the second light-emitting functional portion and the third light-emitting functional portion; or, the PS is located between the first light-emitting functional portion and the third light-emitting functional portion or located between the first light-emitting functional portion and the second light-emitting functional portion.

According to the array substrate provided by one or more embodiments of the present disclosure, the light-emitting functional layer further includes a third light-emitting functional portion; and the first light-emitting functional portion, the second light-emitting functional portion and the third light-emitting functional portion belong to sub-pixels emitting light of different colors, respectively; every two of the first light-emitting functional portion, the second light-emitting functional portion and the third light-emitting functional portion are adjacent to each other; the first light-emitting functional portion and the second light-emitting functional portion are arranged sequentially; the third light-emitting functional portion is located at a same side of the first light-emitting functional portion and the second light-emitting functional portion and is connected with the first light-emitting functional portion and the second light-emitting functional portion, respectively; the PS is located between the first light-emitting functional portion, the second light-emitting functional portion and the third light-emitting functional portion.

According to the array substrate provided by one or more embodiments of the present disclosure, the light-emitting functional layer further includes two third light-emitting functional portions; and the first light-emitting functional portion, the second light-emitting functional portion and the third light-emitting functional portion belong to sub-pixels emitting light of different colors, respectively; the first light-emitting functional portion and the second light-emitting functional portion are arranged sequentially; the two third light-emitting functional portions are located at a same side of the first light-emitting functional portion and the second light-emitting functional portion and are connected with the first light-emitting functional portion and the second light-emitting functional portion, respectively; the PS is located between the first light-emitting functional portion, the second light-emitting functional portion and the two third light-emitting functional portions.

According to the array substrate provided by one or more embodiments of the present disclosure, the first recess is provided between every two protrusions of the plurality of protrusions; the four protrusions include a first protrusion, a second protrusion, a third protrusion and a fourth protrusion; an orthographic projection of the first protrusion and an orthographic projection of the second protrusion on the base substrate fall within an orthographic projection of the first light-emitting functional portion and an orthographic projection of the second light-emitting functional portion on the base substrate, respectively; an orthographic projection of the third protrusion and an orthographic projection of the fourth protrusion on the base substrate fall within orthographic projections of the two third light-emitting functional portions on the base substrate, respectively; a size of the first recess between the first protrusion and the second protrusion along an extension direction of the PS is smaller than a size of the first recess between the third protrusion and the fourth protrusion along the extension direction of the PS.

According to the array substrate provided by one or more embodiments of the present disclosure, at least parts of boundaries of two adjacent light-emitting functional portions are located in a same first recess; or, at least parts of boundaries of two adjacent light-emitting functional portions are connected in a same first recess, and a region covered by each of the light-emitting functional portions includes at least one protrusion.

According to the array substrate provided by one or more embodiments of the present disclosure, both an amount and an area of the protrusions in regions covered by different light-emitting functional portions are the same for the different light-emitting functional portions.

According to the array substrate provided by one or more embodiments of the present disclosure, two adjacent protrusions are symmetrical with respect to a center of the first recess between the two adjacent protrusions.

According to the array substrate provided by one or more embodiments of the present disclosure, the array substrate includes a plurality of PSs, and a distance between adjacent PS s is greater than a maximum size of the first recess in a direction parallel with the base substrate.

According to the array substrate provided by one or more embodiments of the present disclosure, a maximum size of the first recess in a direction parallel with the base substrate is greater than or equal to a maximum size of the first recess in a direction perpendicular to the base substrate.

According to the array substrate provided by one or more embodiments of the present disclosure, the array substrate further includes a pixel definition layer (PDL) located between the base substrate and the PS; the PDL is provided with a plurality of openings, the plurality of openings are in one-to-one correspondence with a plurality of sub-pixels, and the PS and the PDL are formed as an integral structure.

At least one embodiment of the present disclosure further provides a display device, including any array substrate described above.

At least one embodiment of the present disclosure further provides a manufacturing method of an array substrate, including: forming a photo spacer (PS) on a base substrate, the PS including a plurality of protrusions protruded in a direction away from the base substrate and a first recess located between adjacent protrusions; and aligning the base substrate with a first fine metal mask (FMM), and forming a first light-emitting functional portion on the base substrate by using an evaporation process; the first FMM includes a first rib and a first through hole enclosed by a first side surface of the first rib; and in forming the first light-emitting functional portion, an orthographic projection of a portion of a first ridged edge on the base substrate falls within an orthographic projection of the first recess on the base substrate; the first ridged edge is formed by the first side surface intersecting with a first surface of the first rib which contacts the PS.

According to the manufacturing method provided by one or more embodiments of the present disclosure, one of the adjacent protrusions contacts the first rib, and the other one of the adjacent protrusions has no contact with the first rib.

According to the manufacturing method provided by one or more embodiments of the present disclosure, the method further includes: forming a second light-emitting functional portion on the base substrate by using an evaporation process; forming the second light-emitting functional portion includes: aligning the base substrate with a second FMM; the second FMM includes a second rib and a second through hole enclosed by a second side surface of the second rib; and in fabricating the second light-emitting functional portion, an orthographic projection of a portion of a second ridged edge on the base substrate falls within the orthographic projection of the first recess on the base substrate; the second ridged edge is formed by the second side surface intersecting with a second surface of the second rib which contacts the PS; in forming the first light-emitting functional portion, one of the adjacent protrusions supports the first rib of the first FMM; and in forming the second light-emitting functional portion, the other one of the adjacent protrusions supports the second rib of the second FMM.

According to the manufacturing method provided by one or more embodiments of the present disclosure, the method further includes: before forming the PS, forming a pixel definition layer (PDL) on the base substrate, the PDL including a plurality of openings; forming the PDL and forming the PS includes: forming a first film on the base substrate; and exposing and developing the first film by using a multi-tone mask as a mask to form the PDL, the PS and the plurality of openings simultaneously.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "On," "under," "right," "left" and the like are only used to indicate relative position relationship, and when the position of the described object is changed, the relative position relationship may be changed accordingly.

Figure 1:
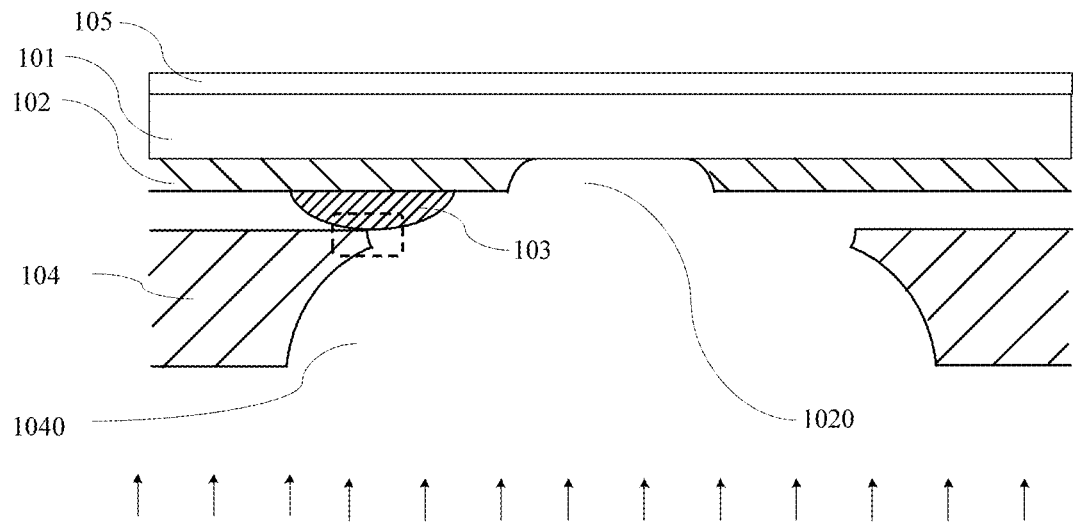
FIG. 1 is a schematic diagram of evaporating a light-emitting functional layer by using an FMM.

FIG. 1 is a schematic diagram of evaporating a light-emitting functional layer by using an FMM. A pixel definition layer (PDL) 102 is formed on a base substrate 101, the PDL 102 has an opening 1020. A photo spacer (PS) 103 is disposed on the PDL 102 and plays a role of supporting the FMM 104; the FMM 104 has a through hole 1040, the through hole 1040 may be a hole formed by an etching process; an evaporation material passes through the through hole 1040 in a bottom-up direction and is deposited onto the base substrate 101. In order to prevent the FMM from damaging a film layer on the base substrate 101, the PS is disposed on the base substrate 101 to support the FMM during an evaporation process. During the evaporation process, the base substrate 101 is placed above the FMM 104, the PS 103 is attached with the FMM. In order to improve an accuracy of an evaporated position, usually, it also needs to place a Gaussian plate 105 with strong magnetism above the base substrate 101 to adsorb the FMM 104 upwards, so that the FMM 104 is attached with the base substrate 101 more tightly. The arrow in FIG. 1 indicates a direction of air flow.

Because the FMM is made of a metallic material, when it's in contact with the base substrate 101, a material deposited on the base substrate 101 may be easily damaged. Thus, in the design of OLED backboard, the PS 103 plays a role of support when the FMM 104 is attached with the base substrate 101, so as to prevent the FMM 104 from scratching a surface of the base substrate 101. The PS 103 may be arranged in an array throughout the entire panel, without limited thereto.

As illustrated in FIG. 1, the PS 103 has an appearance of a protruded structure with its middle portion having a greater height and its edge portion having a smaller height, a ridged edge of the FMM where the through hole 1040 is formed is relatively sharp and burrs may be formed thereon. During attaching in an evaporation process, it usually needs to perform an alignment over and over again, and a Gaussian plate 105 with strong magnetism is positioned above the FMM to adsorb the FMM; during the process of the base substrate 101 attaching with and separating from the FMM, a relative sliding may easily occur, and a force is concentrated at a position where a center of the PS 103 contacting a ridged edge of the opening of the FMM, as illustrated in the dashed box of FIG. 1. The PS 103 usually is made of an organic material, and is easily scratched by the FMM and generate foreign substances such as particles, which affect the product yield and product life.

Figure 2A:
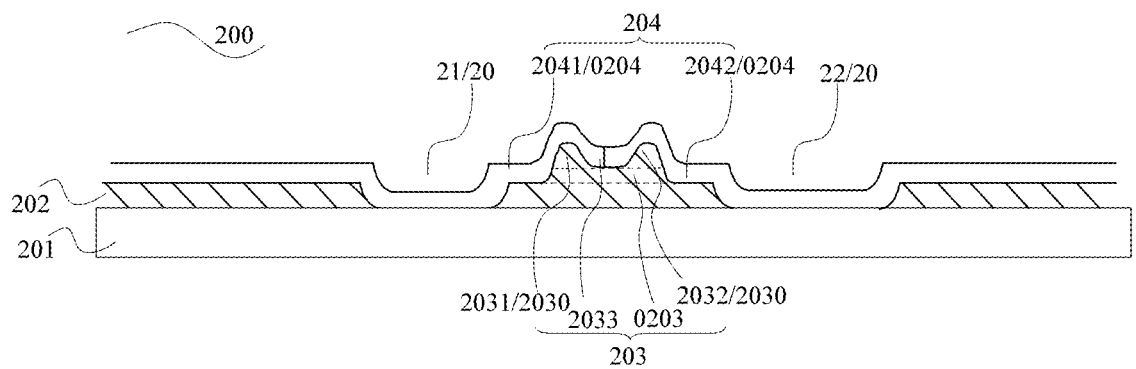
FIG. 2A is a sectional view of an array substrate provided by an embodiment of the present disclosure.

FIG. 2A is a sectional view of an array substrate provided by an embodiment of the present disclosure. As illustrated in FIG. 2A, the array substrate 200 includes a base substrate 201, a light-emitting functional layer 204 and a photo spacer (PS) 203. The light-emitting functional layer 204 includes a plurality of light-emitting functional portions 0204, the plurality of light-emitting functional portions 0204 include a first light-emitting functional portion 2041 and a second light-emitting functional portion 2042 adjacent to each other. The PS 203 is located between the first light-emitting functional portion 2041 and the second light-emitting functional portion 2042, the PS 203 includes a plurality of protrusions 2030 protruded in a direction away from the base substrate 201 and a first recess 2033 located between adjacent protrusions 2030. FIG. 2A illustratively shows the first light-emitting functional portion 2014 and the second light-emitting functional portion 2042 among the plurality of light-emitting functional portions 0204. For example, in the embodiment of the present disclosure, "a first element and a second element adjacent to each other/adjacent first element and second element" refers to that, there is no other first element and no other second element provided between this first element and this second element. In the case where the first element and the second element are elements of the same type, there is no other element of such type provided between the two elements. For example, an element different from the first element and different from the second element may be provided between the first element and the second element adjacent to each other. For example, there is no other first light-emitting functional portion 2041 and no other second light-emitting functional portion 2042 provided between the first light-emitting functional portion 2041 and the second light-emitting functional portion 2042 adjacent to each other. There is no other protrusion 2030 provided between the adjacent protrusions 2030.

For example, the light-emitting functional layer 204 may be an organic layer which is located between an anode and a cathode in an OLED and may be formed by using an evaporation method. For example, the light-emitting functional layer 204 may include a light-emitting layer, and may further include other functional layer(s); for example, it may further include at least one selected from the group consisting of a hole injection layer, a hole transportation layer, an electron transportation layer, an electron injection layer and the like, without limited thereto.

For example, one of the adjacent protrusions 2030 is configured to support a first rib of a first fine metal mask (first FMM) that encloses a first through hole, in fabricating the first light-emitting functional portion 2041, so that an orthographic projection of a portion of a first ridged edge on the base substrate 201 falls within an orthographic projection of the first recess 2033 on the base substrate 201, the first ridged edge is formed by a first side surface of the first rib intersecting with a first surface of the first rib, wherein the first side surface encloses the first through hole, and wherein the first surface contacts the PS; the other one of the adjacent protrusions 2030 is configured to support a second rib of a second fine metal mask (second FMM) that encloses a second through hole, in fabricating the second light-emitting functional portion 2042, so that an orthographic projection of a portion of a second ridged edge on the base substrate 201 falls within an orthographic projection of the first recess 2033 on the base substrate 201, the second ridged edge is formed by a second side surface of the second rib intersecting with a second surface of the second rib, wherein the second side surface encloses the second through hole, and wherein the second surface contacts the PS.

In the array substrate provided by the embodiment of the present disclosure, the PS includes a first recess 2033 between adjacent protrusions 2030; as a result, in fabricating the light-emitting functional portions, it allows an orthographic projection of a portion of a ridged edge of the FMM on the base substrate to fall within an orthographic projection of the first recess 2033 on the base substrate 201, so as to prevent the sharp, ridged edge of the FMM from scratching the PS and generating particles, thereby improving the product yield and the product life.

For example, as illustrated in FIG. 2A, the adjacent protrusions 2030 include a first protrusion 2031 and a second protrusion 2032; in fabricating the first light-emitting functional portion 2041, the second protrusion 2032 supports the first rib of the first FMM; and in fabricating the second light-emitting functional portion 2042, the first protrusion 2031 supports the second rib of the second FMM. That is, in fabricating the light-emitting functional portion 0204, the protrusion away from the light-emitting functional portion 0204 is adopted to support the FMM for forming the light-emitting functional portion 0204, while the protrusion close to the light-emitting functional portion 0204 does not support the FMM for forming the light-emitting functional portion 0204.

For example, as illustrated in FIG. 2A, the PS 203 further includes a base portion 0203, the plurality of protrusions 2030 are located at a side of the base portion 0203 away from the base substrate 201. The plurality of protrusions 2030 and the base portion 0203 may be formed as an integral structure, without limited thereto. In some other embodiments, the plurality of protrusions 2030 and the base portion 0203 may also be fabricated separately.

For example, as illustrated in FIG. 2A, the array substrate 200 further includes a pixel definition layer (PDL) 202 located between the base substrate 201 and the PS 203, the PDL 202 is provided with a plurality of openings 20, the plurality of openings 20 are in one-to-one correspondence with a plurality of sub-pixels. For example, the PS 203 and the PDL 202 are formed as an integral structure, without limited thereto. In some other embodiments, the PS 203 and the PDL 202 may also be fabricated separately. For example, as illustrated in FIG. 2A, the plurality of openings 20 include a first opening 21 and a second opening 22. Each of the light-emitting functional portions 0204 corresponds to at least one opening 20. FIG. 2A illustratively shows a first opening 21 and a second opening 22 among the plurality of openings 20.

For example, the PS 203 may be formed by adopting an organic material; for example, the PS 203 may be formed by adopting a resin material; for example, the PS 203 may be formed by adopting a material as same as that of a photoresist, without limited thereto. For example, the PDL 202 may be formed by adopting an organic material; for example, the PDL 202 may be formed by adopting a resin material; for example, the PDL 202 may be formed by adopting a material as same as that of a photoresist, without limited thereto. For example, the PS 203 and the PDL 202 may be formed by adopting a same material, without limited thereto.

For example, as illustrated in FIG. 2A, in order to facilitate an orthographic projection of a portion of a ridged edge of the FMM on the base substrate to fall within an orthographic projection of the first recess 2033 on the base substrate, and in order to provide the ridged edge of the FMM with more movement space, a maximum size of the first recess 2033 in a direction parallel with the base substrate 201 is greater than or equal to a maximum size of the first recess 2033 in a direction perpendicular to the base substrate 201. For example, the maximum size of the first recess 2033 in the direction parallel with the base substrate 201 refers to a distance between top ends of the first protrusion 2033 and the second protrusion 2032 that form the first recess 2033, without limited thereto. For example, the maximum size of the first recess 2033 in the direction perpendicular to the base substrate 201 refers to a maximum distance between, a connecting line of the top ends of the first protrusion 2031 and the second protrusion 2032 that form the first recess 2033, and, a bottom end of the first recess 2033, in the direction perpendicular to the base substrate 201, without limited thereto.

Figure 2B:
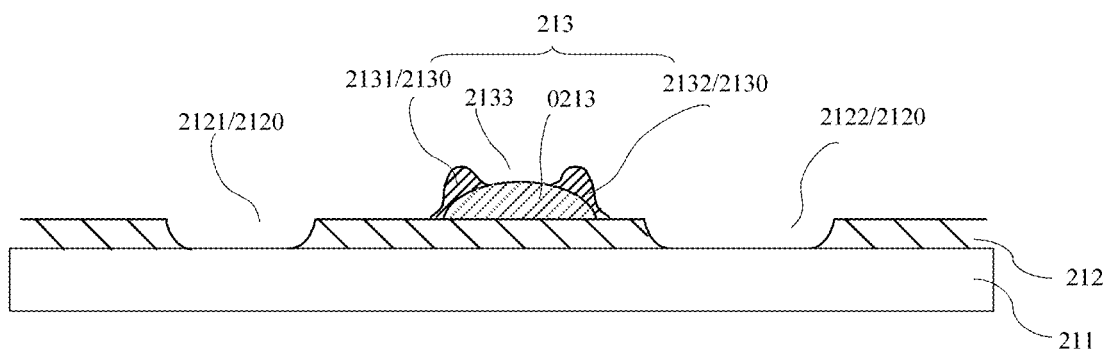
FIG. 2B is a sectional view of an array substrate provided by another embodiment of the present disclosure.

FIG. 2B is a sectional view of an array substrate provided by another embodiment of the present disclosure. As illustrated in FIG. 2B, the array substrate provided by the present embodiment includes a base substrate 211, a PDL 212 and a PS 213. The PDL 212 includes a plurality of openings 2120. The plurality of openings 2120 include a first opening 2121 and a second opening 2122. The PDL 212 has a substantially flat surface at the PS 213. The PS 213 includes a plurality of protrusions 2130 and a first recess 2133 located between adjacent protrusions. The plurality of protrusions 2130 include a first protrusion 2131 and a second protrusion 2132 adjacent to each other. The first recess 2133 is located between the first protrusion 2131 and the second protrusion 2132. The PS 213 includes a base portion 0213; and the PDL 212, the base portion 0213 and the plurality of protrusions 2130 are fabricated separately.

Figure 2C:
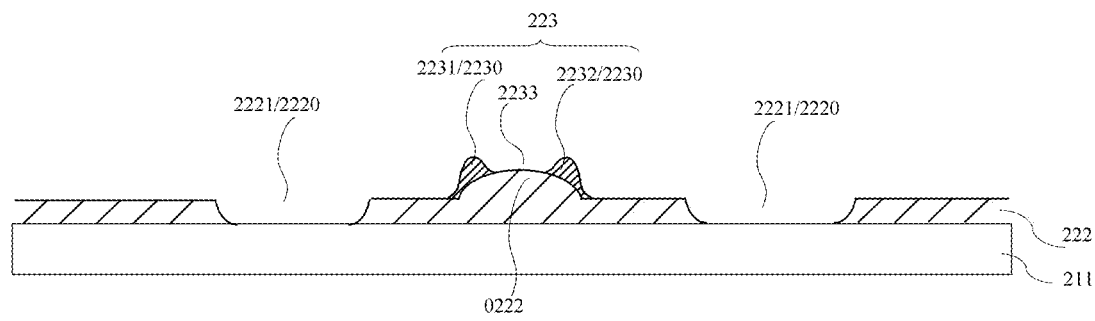
FIG. 2C is a sectional view of an array substrate provided by another embodiment of the present disclosure.

FIG. 2C is a sectional view of an array substrate provided by another embodiment of the present disclosure. As illustrated in FIG. 2C, the array substrate provided by the present embodiment includes a base substrate 211, a PDL 222 and a PS 223. The PDL 222 includes a plurality of openings 2220. The plurality of openings 2220 include a first opening 2221 and a second opening 2222. The PS 223 includes a plurality of protrusions 2230 and a first recess 2233 located between adjacent protrusions 2230. The plurality of protrusions 2230 include a first protrusion 2231 and a second protrusion 2232 adjacent to each other. The first recess 2233 is located between the first protrusion 2231 and the second protrusion 2232. The PDL 222 includes a protruded portion 0222 at the PS; the PDL 222 and the protruded portion 0222 are formed as an integral structure, and are made by adopting a same process from a same film layer; the PS 223 is located on the protruded portion 0222. The PS 223 includes no base portion.

Figure 2D:
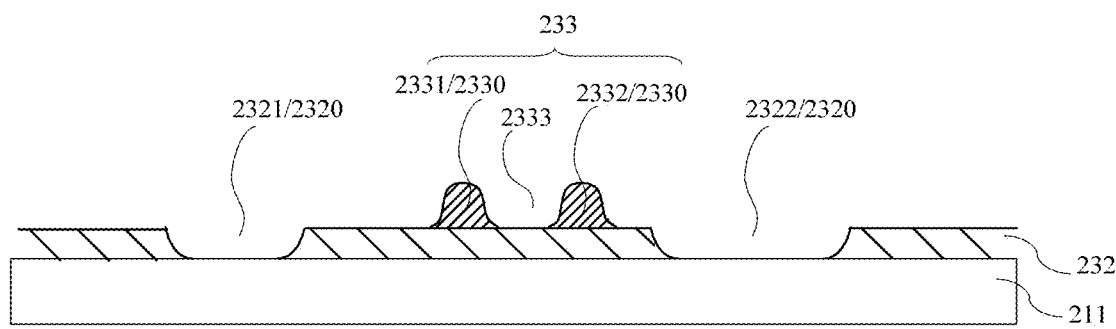
FIG. 2D is a sectional view of an array substrate provided by another embodiment of the present disclosure.

FIG. 2D is a sectional view of an array substrate provided by another embodiment of the present disclosure. As illustrated in FIG. 2D, the array substrate provided by the present embodiment includes a base substrate 211, a PDL 232 and a PS 233. The PDL 232 includes a plurality of openings 2320. The plurality of openings 2320 include a first opening 2321 and a second opening 2322. The PS 233 includes a plurality of protrusions 2330 and a first recess 2333 located between adjacent protrusions 2330. The plurality of protrusions 2330 include a first protrusion 2331 and a second protrusion 2332 adjacent to each other. The first recess 2333 is located between the first protrusion 2331 and the second protrusion 2332. The PDL 232 includes a substantially flat surface at the PS 233. The PS 233 includes no base portion. For example, the PS 233 includes only the plurality of protrusions 2330 and the first recess 2333 between adjacent protrusions 2330.

For the clarity of illustration, the first light-emitting functional portion and the second light-emitting functional portion are not illustrated in FIG. 2B-FIG. 2D, and reference may be made to FIG. 2A.

Figure 3:
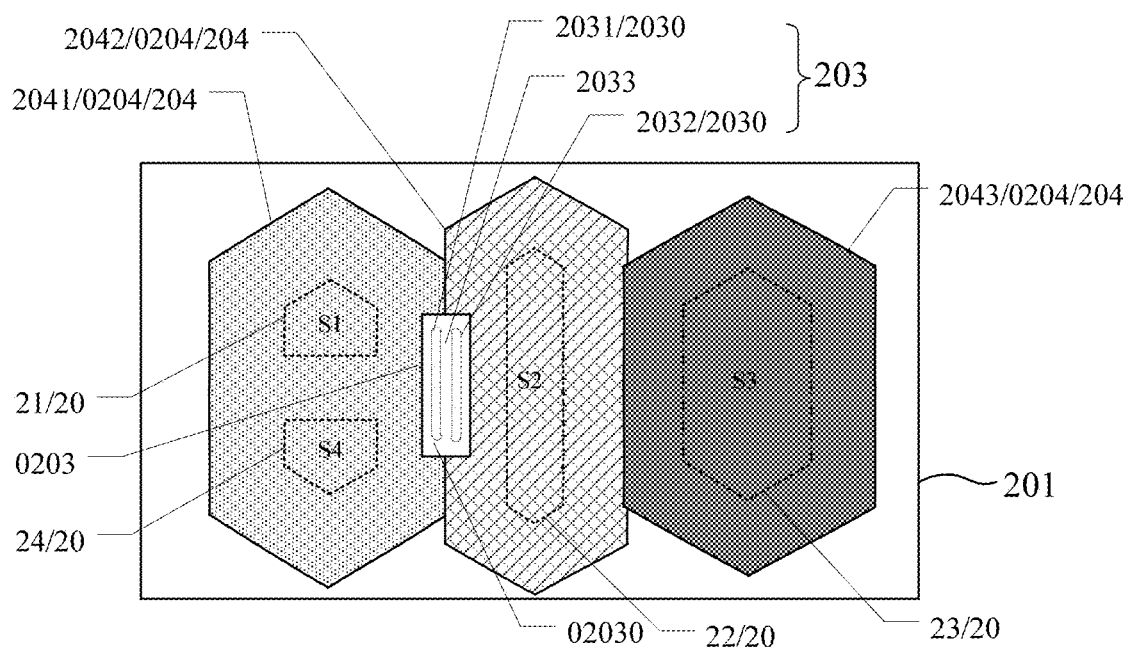
FIG. 3 is a top view of an array substrate provided by an embodiment of the present disclosure.

FIG. 3 is a top view of an array substrate provided by an embodiment of the present disclosure. For example, FIG. 2A may be a sectional view of FIG. 3, without limited thereto.

For example, as illustrated in FIG. 3, orthographic projections of the plurality of protrusions 2030 on the base substrate 201 fall within an orthographic projection of the base portion 0203 on the base substrate 203; that is, the plurality of protrusions 2030 are not beyond a boundary of the base portion 0203, without limited thereto. For example, the plurality of protrusions 2030 are located on an edge part 02030 of the base portion 0203.

As illustrated in FIG. 3, the light-emitting functional layer 203 further includes a third light-emitting functional portion 2043. The first light-emitting functional portion 2041, the second light-emitting functional portion 2042 and the third light-emitting functional portion 2043 are arranged, sequentially, from left to right. For example, in fabricating the third light-emitting functional portion 2043, a PS 203 may be utilized to support a third rib of a third fine metal mask (third FMM), the third rib encloses a third through hole. Because a distance from the PS 203 and the third light-emitting functional portion 2043 is relatively far, in fabricating the third light-emitting functional portion 2043, the PS 203 supports a flat portion of the third rib and the third FMM would not scratch the PS 203. As a result, in fabricating the first light-emitting functional portion 2041, the second light-emitting functional portion 2042 and the third light-emitting functional portion 2043, it would not generate particles resulted by the FMM scratching the PS, thereby improving the product yield and the product life.

FIG. 3 further illustrates a plurality of openings 20 of the PDL. FIG. 3 illustrates a first opening 21, a second opening 22, a third opening 23 and a fourth opening 24 of the PDL. As illustrated in FIG. 3, each of the light-emitting functional portions 0204 corresponds to at least one opening 20. For example, the first light-emitting functional portion 2041 corresponds to the first opening 21 and the fourth opening 24; the second light-emitting functional portion 2042 corresponds to the second opening 22; and the third light-emitting functional portion 2043 corresponds to the third opening 23. For example, the light-emitting functional portion 0204 corresponds to the opening 20, which refers to that, an orthographic projection of the opening 20 on the base substrate falls within an orthographic projection of the light-emitting functional portion 0204 on the base substrate.

As illustrated in FIG. 3, each of the openings 20 may correspond to one sub-pixel. A sub-pixel may be the smallest unit controllable independently in the array substrate to perform displaying. For example, as illustrated in FIG. 3, the first opening 21 may correspond to a first sub-pixel S1, the second opening 22 may correspond to a second sub-pixel S2, the third opening 23 may correspond to a third sub-pixel S3, and the fourth opening 24 may correspond to a fourth sub-pixel S4. Sub-pixels corresponding to the same light-emitting functional portion 0204 are of the same color. For example, as illustrated in FIG. 3, both the first sub-pixel S1 and the fourth sub-pixel S4 are green sub-pixels; the second sub-pixel S2 is a red sub-pixel, and the third sub-pixel S3 is a blue sub-pixel, without limited thereto.

For example, as illustrated in FIG. 3, the PS 203 includes two strip-shaped protrusions 2030 which are a first protrusion 2031 and a second protrusion 2032; the two strip-shaped protrusions 2030 extend along an extension direction of the light-emitting functional portion 0204. For example, as illustrated in FIG. 3, the light-emitting functional portion 0204 extends in a vertical direction. For example, as illustrated in FIG. 3, the plurality of light-emitting functional portions 0204 are arranged along a horizontal direction. The extension direction of the light-emitting functional portion 0204 may refer to an extension direction of one edge of the light-emitting functional portion 0204. For example, as illustrated in FIG. 3, the two strip-shaped protrusions 2030 extend along an extension direction of one edge of the light-emitting functional portion 0204. For example, as illustrated in FIG. 3, a length of the two strip-shaped protrusions 2030 along the extension direction of the light-emitting functional portion 0204 is smaller than a length of the base portion 0203 along the extension direction of the light-emitting functional portion 0204.

For example, as illustrated in FIG. 3, an orthographic projection of the first protrusion 2031 on the base substrate 201 falls within an orthographic projection of the first light-emitting functional portion 2041 on the base substrate 201; and an orthographic projection of the second protrusion 2032 on the base substrate 201 falls within an orthographic projection of the second light-emitting functional portion 2042 on the base substrate 201.

For example, as illustrated in FIG. 3, the first sub-pixel S1 and the fourth sub-pixel S4 adopt different parts of the same first light-emitting functional portion 2041. That is, light-emitting functional layers of the first sub-pixel S1 and the fourth sub-pixel S4 may be formed through the same opening of the FMM.

Figure 4:
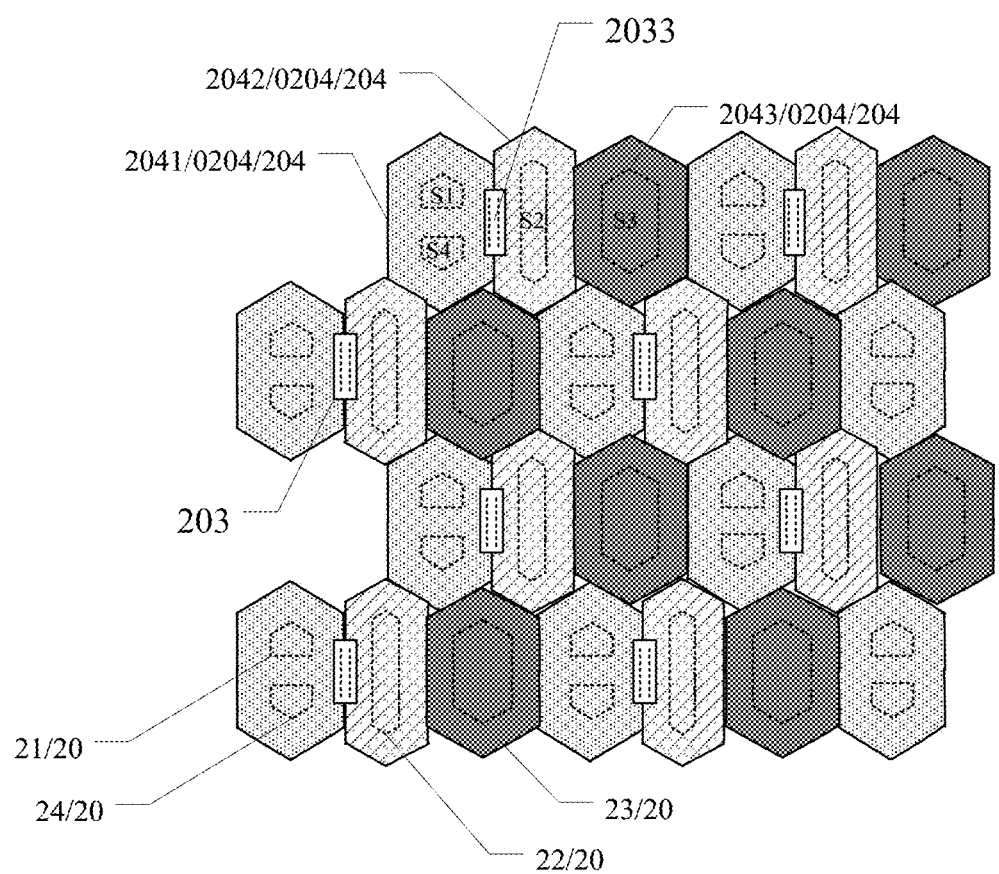
FIG. 4 is a schematic diagram illustrating a pixel arrangement of an array substrate provided by an embodiment of the present disclosure.

FIG. 4 is a schematic diagram illustrating a pixel arrangement of an array substrate provided by an embodiment of the present disclosure. In the pixel arrangement of FIG. 4, an arrangement of sub-pixels in a row direction is as same as that of FIG. 3, and sub-pixels in adjacent rows are staggered in the row direction; for example, the sub-pixels in adjacent rows are staggered in the row direction by a size of one half of a sub-pixel in the row direction, without limited thereto. The pixel arrangement in FIG. 4 may form a GGRB pixel arrangement. For purpose of clarity, the protrusion is illustrated in FIG. 4 as a dashed line inside the PS 203.

As illustrated in FIG. 3 and FIG. 4, the PS 203 is located between the first light-emitting functional portion 2041 and the second light-emitting functional portion 2042; and there is no PS provided between the second light-emitting functional portion 2042 and the third light-emitting functional portion 2043, or between the third light-emitting functional portion 2043 and the first light-emitting functional portion 2041.

For example, as illustrated in FIG. 4, the first light-emitting functional portion 2041, the second light-emitting functional portion 2042 and the third light-emitting functional portion 2043 belong to sub-pixels emitting light of different colors, respectively; the first light-emitting functional portion 2041, the second light-emitting functional portion 2042 and the third light-emitting functional portion 2043 are arranged sequentially; or, ever two of the first light-emitting functional portion 2041, the second light-emitting functional portion 2042 and the third light-emitting functional portion 2043 are adjacent to each other.

For example, as illustrated in FIG. 3 and FIG. 4, the array substrate includes a plurality of PSs 203, and a distance between adjacent PSs 203 is greater than the maximum size of the first recess 2033 in the direction parallel with the base substrate 201.

For example, as illustrated in FIG. 4, the PS 203 has a strip shape, and each of the plurality of protrusions extends along a direction of long side of the strip. For example, in FIG. 4, the strip-shaped PS 203 extends along a vertical direction, and each of the protrusions also extends along the vertical direction. For example, as illustrated in FIG. 4, a length of the protrusion is smaller than or equal to a size of a side surface of the PS away from the base substrate in the direction of long side of the PS, and the first recess extends between the adjacent protrusions along the direction of long side of the PS.

For the pixel arrangement illustrated in FIG. 4, in some other embodiments, the position and the pattern of the PS may also be adjusted. Another type of PS will be described in the following embodiment.

For example, as illustrated in FIG. 3 and FIG. 4, a boundary of each of the light-emitting functional portions 0204 may correspond to a ridged edge which is formed by a side surface of a rib intersecting with a surface of the rib contacting the PS, the rib is of an FMM for fabricating the light-emitting functional portion 0204, and the side surface of the rib forms the through hole of the light-emitting functional portion 0204; the following may be the same case, without limited thereto.

For example, as illustrated in FIG. 3 and FIG. 4, the first protrusion 2031 and the second protrusion 2032 are parallel with each other.

For example, as illustrated in FIG. 3 and FIG. 4, the first light-emitting functional portion 2041, the second light-emitting functional portion 2042 and the third light-emitting functional portion 2043 that are adjacent to each other, sequentially, in the row direction, as well as the PS 203 located between the first light-emitting functional portion 2041 and the second light-emitting functional portion 2042, may constitute one repetitive unit.

Figure 5:
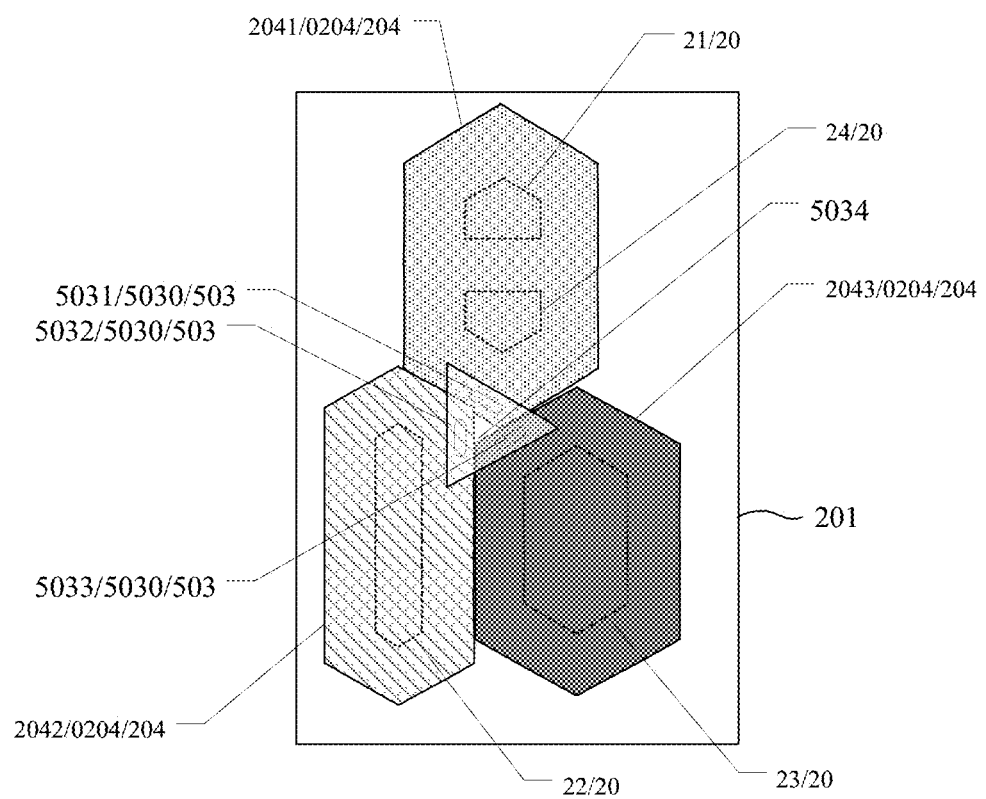
FIG. 5 is a schematic diagram of an array substrate provided by another embodiment of the present disclosure.

FIG. 5 is a schematic diagram of an array substrate provided by another embodiment of the present disclosure. As illustrated in FIG. 5, the PS 503 is located between the first light-emitting functional portion 2041, the second light-emitting functional portion 2042 and the third light-emitting functional portion 2043. The PS 503 includes a plurality of protrusions 5030 protruded in a direction away from the base substrate 201 and a first recess 5034 located between adjacent protrusions 5030.

For example, in the embodiment of the present disclosure, the PS is located between the plurality of light-emitting functional portions, which may be understood as: the PS is located between openings corresponding to the plurality of light-emitting functional portions and is covered by at least one of the plurality of light-emitting functional portions, without limited thereto. For example, in the embodiment of the present disclosure, the PS is located between two light-emitting functional portions, which may be understood as: the PS is located between openings corresponding to the two light-emitting functional portions and is covered by at least one of the two light-emitting functional portions, without limited thereto. For example, in the embodiment of the present disclosure, the PS is located between three light-emitting functional portions, which may be understood as: the PS is located between openings corresponding to the three light-emitting functional portions and is covered by at least one of the three light-emitting functional portions, without limited thereto.

For example, as illustrated in FIG. 5, the plurality of protrusions 5030 include a first protrusion 5031, a second protrusion 5032 and a third protrusion 503. A first recess 5034 is located between the first protrusion 5031, the second protrusion 5032 and the third protrusion 5033. For example, the first recess 5034 is enclosed by the first protrusion 5031, the second protrusion 5032 and the third protrusion 5033. For example, in fabricating each of the light-emitting functional portions, it always utilizes two protrusions in the PS 503 away from the light-emitting functional portion to support the FMM. For example, in fabricating the first light-emitting functional portion 2041, the second protrusion 5032 and the third protrusion 5033 are utilized to support a first rib of a first FMM which encloses a first through hole, so that an orthographic projection of a portion of a first ridged edge on the base substrate 201 falls within an orthographic projection of the first recess 5034 on the base substrate 201, the first ridged edge is formed by a first side surface of the first rib intersecting with a first surface of the first rib, wherein the first side surface encloses the first through hole, and wherein the first surface contacts the PS. For example, in fabricating the second light-emitting functional portion 2042, the first protrusion 5031 and the third protrusion 5033 are utilized to support a second rib of a second FMM which encloses a second through hole, so that an orthographic projection of a portion of a second ridged edge on the base substrate 201 falls within an orthographic projection of the first recess 5034 on the base substrate 201, the second ridged edge is formed by a second side surface of the second rib intersecting with a second surface of the second rib, wherein the second side surface encloses the second through hole, and wherein the second surface contacts the PS. For example, in fabricating the third light-emitting functional portion 2043, the first protrusion 5031 and the second protrusion 5032 are utilized to support a third rib of a third FMM which encloses a third through hole, so that an orthographic projection of a portion of a third ridged edge on the base substrate 201 falls within an orthographic projection of the first recess 5034 on the base substrate 201, the third ridged edge is formed by a third side surface of the third rib intersecting with a third surface of the third rib, wherein the third side surface encloses the third through hole, and wherein the third surface contacts the PS. For example, a first evaporation material passes through the first through hole to form the first light-emitting functional portion 2041 on the base substrate 201; a second evaporation material passes through the second through hole to form the second light-emitting functional portion 2042 on the base substrate 201; and a third evaporation material passes through the third through hole to form the third light-emitting functional portion 2043 on the base substrate 201.

For example, as illustrated in FIG. 5, the PS 503 includes three protrusions 5030, and the three protrusions 5030 are located on three sides of a triangle, respectively. For example, as illustrated in FIG. 5, a first recess 5034 is provided between every two protrusions 5030 of the three protrusions 5030. For example, as illustrated in FIG. 5, in a top view, the three protrusions 5030 are arranged to be spaced apart from each other. For example, the three protrusions 5030 are arranged to be close to the openings corresponding to the first light-emitting functional portion 2041, the second light-emitting functional portion 2042 and the third light-emitting functional portion 2043, respectively.

For example, as illustrated in FIG. 5, an orthographic projection of the first protrusion 5031 on the base substrate 201 falls within an orthographic projection of the first light-emitting functional portion 2041 on the base substrate 201; an orthographic projection of the second protrusion 5032 on the base substrate 201 falls within an orthographic projection of the second light-emitting functional portion 2042 on the base substrate 201; and an orthographic projection of the third protrusion 5033 on the base substrate 201 falls within an orthographic projection of the third light-emitting functional portion 2043 on the base substrate 201.

Figure 6:
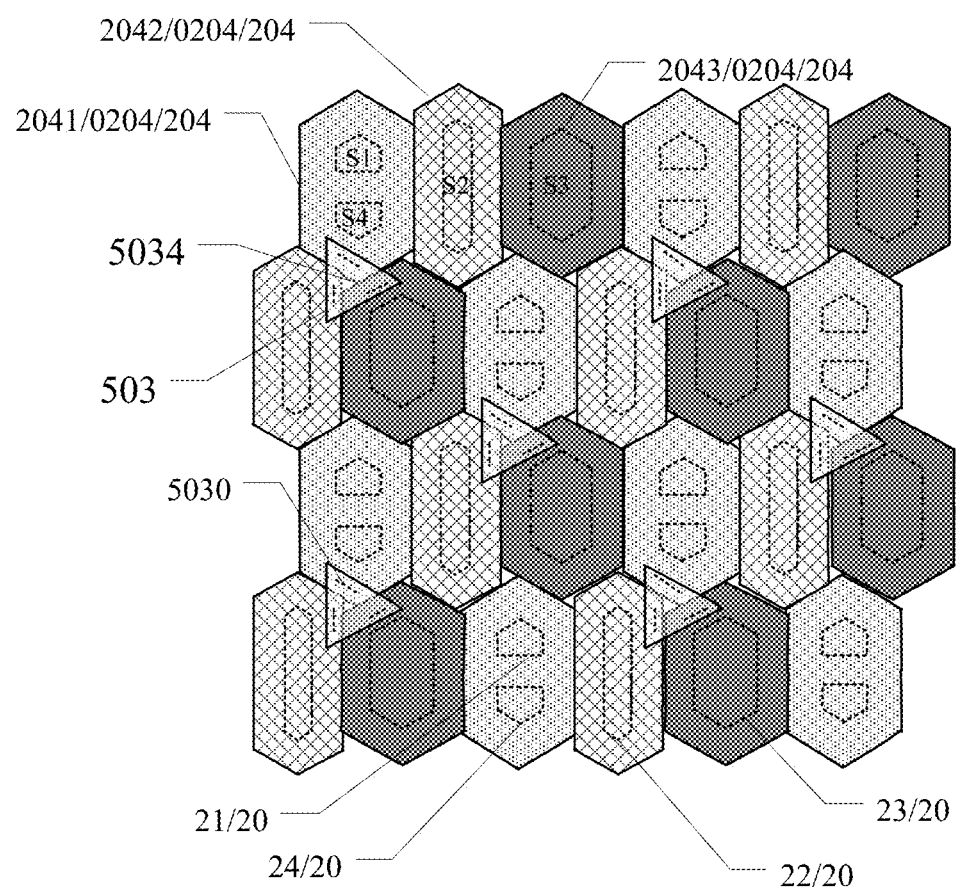
FIG. 6 is a schematic diagram of an array substrate provided by an embodiment of the present disclosure.

FIG. 6 is a schematic diagram of an array substrate provided by an embodiment of the present disclosure. FIG. 5 may be a portion of FIG. 6. As illustrated in FIG. 6, in order to prevent the PS from blocking light and resulting in a color cast, the PS 503 is provided only between the second light-emitting functional portion 2042 and the third light-emitting functional portion 2043 that are adjacent in the same row, and the first light-emitting functional portion 2041 in an adjacent row at the same side of the second and third light-emitting functional portions, and is provided at no other positions, without limited thereto. For sake of clarity, the protrusion 5030 is illustrated in FIG. 6 as a dashed line in the PS 503.

For example, as illustrated in FIG. 5 and FIG. 6, the array substrate includes a plurality of PSs 503, and a distance between adjacent PSs 503 is greater than a maximum size of the first recess 5034 in the direction parallel with the base substrate 201.

For example, in some embodiments, as illustrated in FIG. 5 and FIG. 6, every two of the first protrusion 2031, the second protrusion 2032 and the third protrusion 2033 are not parallel with each other.

For example, as illustrated in FIG. 5 and FIG. 6, two adjacent first light-emitting functional portions 2041, two adjacent second light-emitting functional portions 2042 and two adjacent third light-emitting functional portions 2043, as well as the PS 503 located between the first light-emitting functional portion 2041, the second light-emitting functional portion 2042 and the third light-emitting functional portion 2043, may constitute one repetitive unit.

Figure 7A:
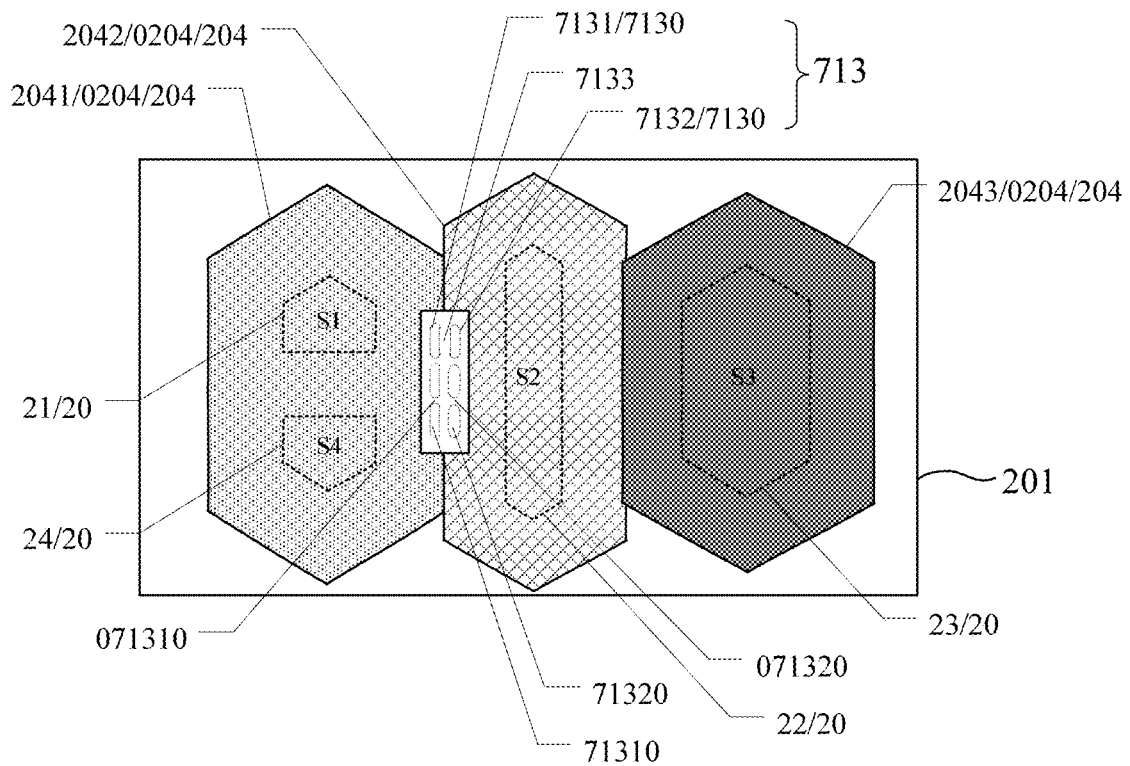
FIG. 7A is a schematic diagram of an array substrate provided by an embodiment of the present disclosure.

FIG. 7A is a schematic diagram of an array substrate provided by an embodiment of the present disclosure. As compared with FIG. 3, the PS 713 included in the array substrate provided by the present embodiment is different from the PS 203. The PS 713 includes a plurality of protrusions 7130 protruded in a direction away from the base substrate 201 and a first recess 7133 located between adjacent protrusions 7130. The plurality of protrusions 7130 include a first protrusion 7131 and a second protrusion 7132. The first protrusion 7131 includes three sub-protrusions 71310, and the second protrusion 7132 includes three sub-protrusions 71320. A second recess 071310 is provided between adjacent sub-protrusions 71310, and a size of the second protrusion 071310 in the direction parallel with the base substrate is smaller than or equal to a size of the first recess 7133 in the direction parallel with the base substrate. A second recess 071320 is provided between adjacent sub-protrusions 71320, and a size of the second recess 071320 in the direction parallel with the base substrate is smaller than or equal to the size of the first recess 7133 in the direction parallel with the base substrate. In the embodiment of the present disclosure, the amount of the sub-protrusions included in each of the protrusions is not limited to that illustrated in the drawings.

Figure 7B:
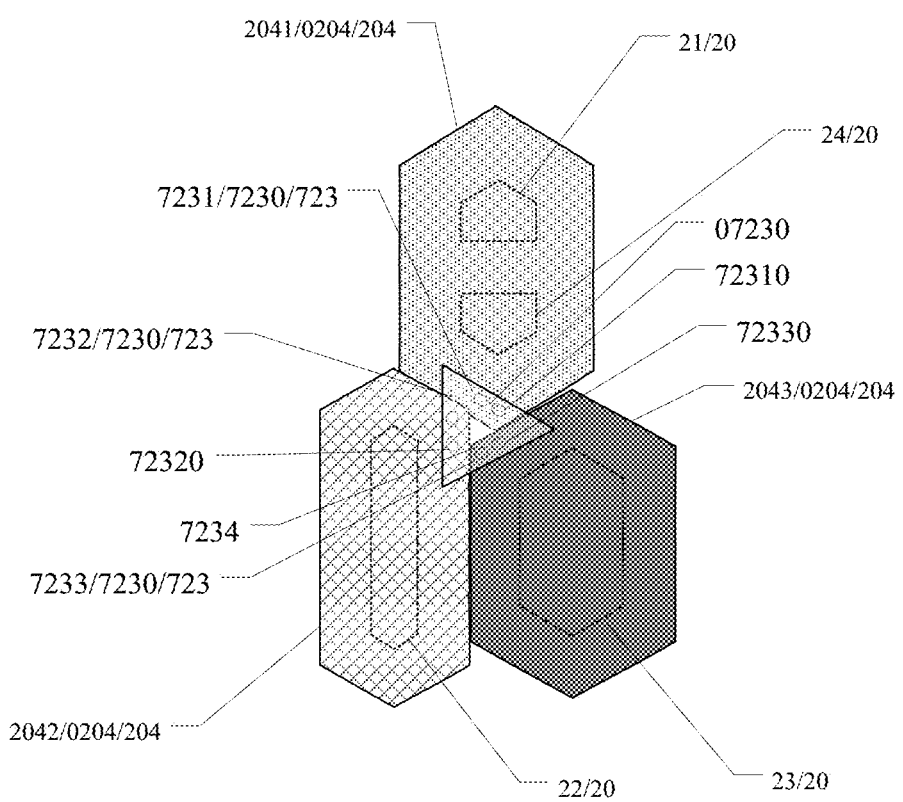
FIG. 7B is a schematic diagram of an array substrate provided by an embodiment of the present disclosure.

FIG. 7B is a schematic diagram of an array substrate provided by an embodiment of the present disclosure. As compared with FIG. 5, the PS 723 included in the array substrate provided by the present embodiment is different from the PS 503. The PS 723 includes a plurality of protrusions 7230 protruded in a direction away from the base substrate 201 and a first recess 7234 located between adjacent protrusions 7230. The plurality of protrusions 7230 include a first protrusion 7231, a second protrusion 7232 and a third protrusion 7233. The first protrusion 7231 includes two sub-protrusions 72310, the second protrusion 7232 includes two sub-protrusions 72320, and the third protrusion 7233 includes two sub-protrusions 72330. A second recess 07230 is provided between adjacent sub-protrusions 72310, and a size of the second recess 07230 in the direction parallel with the base substrate is smaller than or equal to the size of the first recess 7233 in the direction parallel with the base substrate. In the embodiment of the present disclosure, the amount of the sub-protrusions included in each of the protrusions is not limited to that illustrated in the drawings.

For example, in the embodiment of the present disclosure, each of the plurality of protrusions includes a plurality of sub-protrusions, a second recess is provided between adjacent sub-protrusions, and a size of the second recess in the direction parallel with the base substrate is smaller than or equal to the size of the first recess in the direction parallel with the base substrate.

Figure 8A:
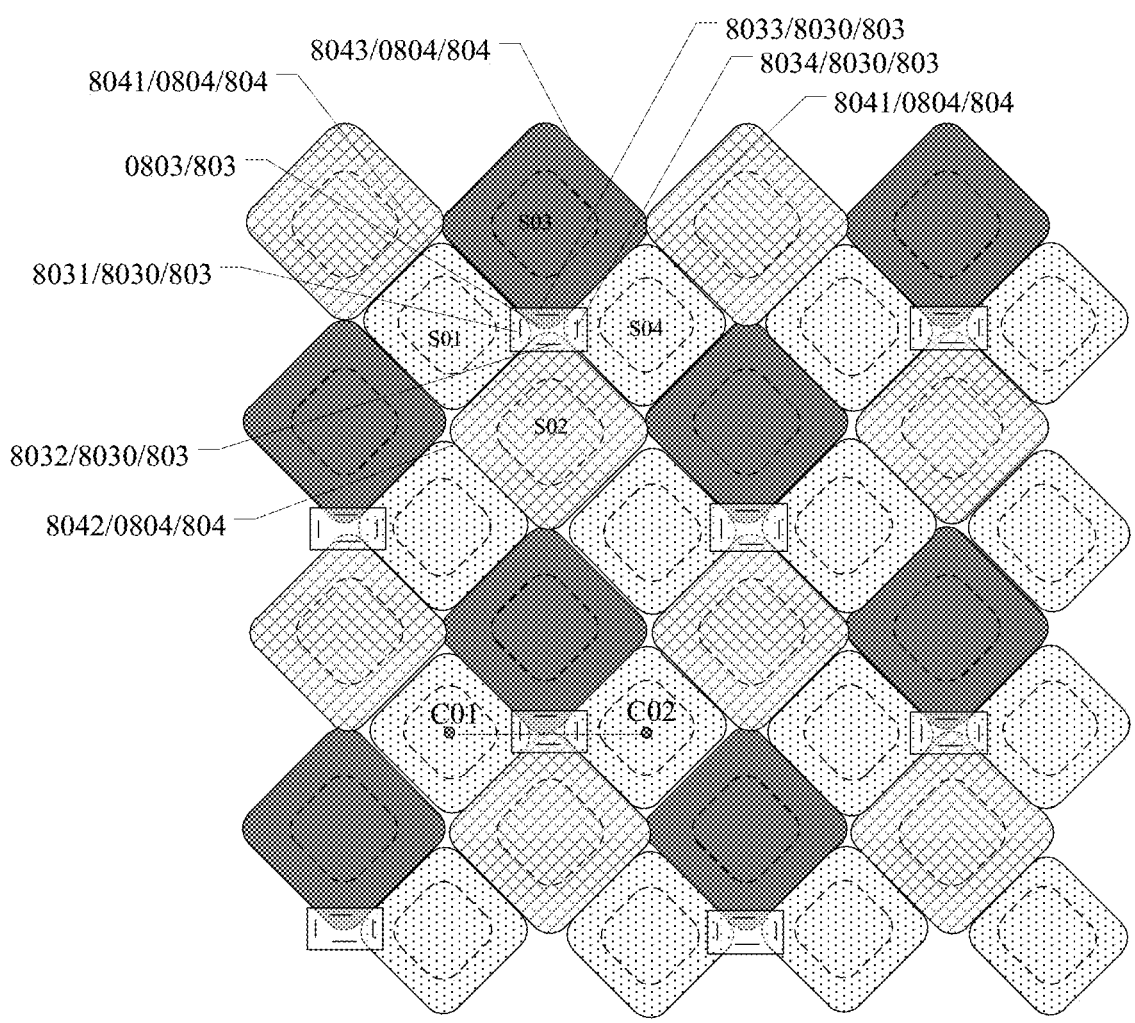
FIG. 8A is a schematic diagram of an array substrate provided by an embodiment of the present disclosure.

FIG. 8A is a schematic diagram of an array substrate provided by an embodiment of the present disclosure. As illustrated in FIG. 8A, the pixel arrangement of the array substrate is a diamond-shaped arrangement. The array substrate includes a PS 803 and a light-emitting functional layer 804; the light-emitting functional layer 804 includes a plurality of light-emitting functional portions 0804, the plurality of light-emitting functional portions 0804 include two first light-emitting functional portions 8041, a second light-emitting functional portion 8042 and a third light-emitting functional portion 8043. The PS 803 is located between the two first light-emitting functional portions 8041, and is located between the second light-emitting functional portion 8042 and the third light-emitting functional portion 8043. The PS 803 includes a plurality of protrusions 8030 protruded in a direction away from the base substrate, and a first recess 0803 located between adjacent protrusions 8030. For example, the first recess 0803 is provided between every two adjacent protrusions 8030 of the plurality of protrusions 8030. For example, the PS 803 has a strip shape, without limited thereto.

For example, as illustrated in FIG. 8A, the plurality of protrusions 8030 include a first protrusion 8031, a second protrusion 8032, a third protrusion 8033 and a fourth protrusion 8034. For example, as illustrated in FIG. 8A, the PS has a strip shape; the PS includes four protrusions, the four protrusions are located on four sides of the PS, respectively; and every side of the PS is provided with one protrusion along an extension direction of the side.

As illustrated in FIG. 8A, the closed, dashed box in the figure represents the opening of the PDL, each of the light-emitting functional portions 0804 corresponds to one opening, and each of the light-emitting functional portions 0804 corresponds to one sub-pixel. FIG. 8A illustrates a first sub-pixel S01, a second sub-pixel S02, a third sub-pixel S03 and a fourth sub-pixel S04; the first sub-pixel S01, the second sub-pixel S02 and the third sub-pixel S03 are sub-pixels of different colors; the first sub-pixel S01 and the fourth sub-pixel S04 are sub-pixels of the same color. For example, the first sub-pixel S01 is a green sub-pixel, the second sub-pixel S02 is a red sub-pixel, and the third sub-pixel S03 is a blue sub-pixel, without limited thereto.

For example, the light-emitting functional portions of the same color are fabricated simultaneously. In fabricating the first light-emitting functional portion 8041, the second protrusion 8032 and the third protrusion 8033 are utilized to support a first FMM, so that an orthographic projection of a portion of a first ridged edge of the first FMM on the base substrate falls within an orthographic projection of the first recess 0803 on the base substrate. In fabricating the second light-emitting functional portion 8042, the first protrusion 8031, the third protrusion 8033 and the fourth protrusion 8034 are utilized to support a second FMM, so that an orthographic projection of a portion of a second ridged edge of the second FMM on the base substrate falls within the orthographic projection of the first recess 0803 on the base substrate. In fabricating the third light-emitting functional portion 8043, the first protrusion 8031, the second protrusion 8032 and the fourth protrusion 8034 are utilized to support a third FMM, so that an orthographic projection of a portion of a third ridged edge of the third FMM on the base substrate falls within the orthographic projection of the first recess 0803 on the base substrate. For example, as illustrated in FIG. 8A, orthographic projections of the first protrusion 8031 and the fourth protrusion 8034 on the base substrate fall within orthographic projections of two adjacent first light-emitting functional portions 8041 on the base substrate, respectively; and orthographic projections of the second protrusion 8032 and the third protrusion 8033 on the base substrate fall within orthographic projections of the second light-emitting functional portion 8042 and the third light-emitting functional portion 8043 on the base substrate, respectively.

For example, in some embodiments, as illustrated in FIG. 8A, the first protrusion 8031 and the fourth protrusion 8034 are parallel with each other; the second protrusion 8032 and the third protrusion 8033 are parallel with each other; the first protrusion 8031 and the second protrusion 8032 are not parallel with each other. For example, the first protrusion 8031 and the second protrusion 8032 are perpendicular to each other, without limited thereto.

For example, as illustrated in FIG. 8A, two adjacent first light-emitting functional portions 8041, two adjacent second light-emitting functional portions 8042 and two adjacent third light-emitting functional portions 8043, as well as the PS 503 located between the two first light-emitting functional portions 8041, the second light-emitting functional portion 8043 and the third light-emitting functional portion 8043, may constitute one repetitive unit.

Figure 8B:
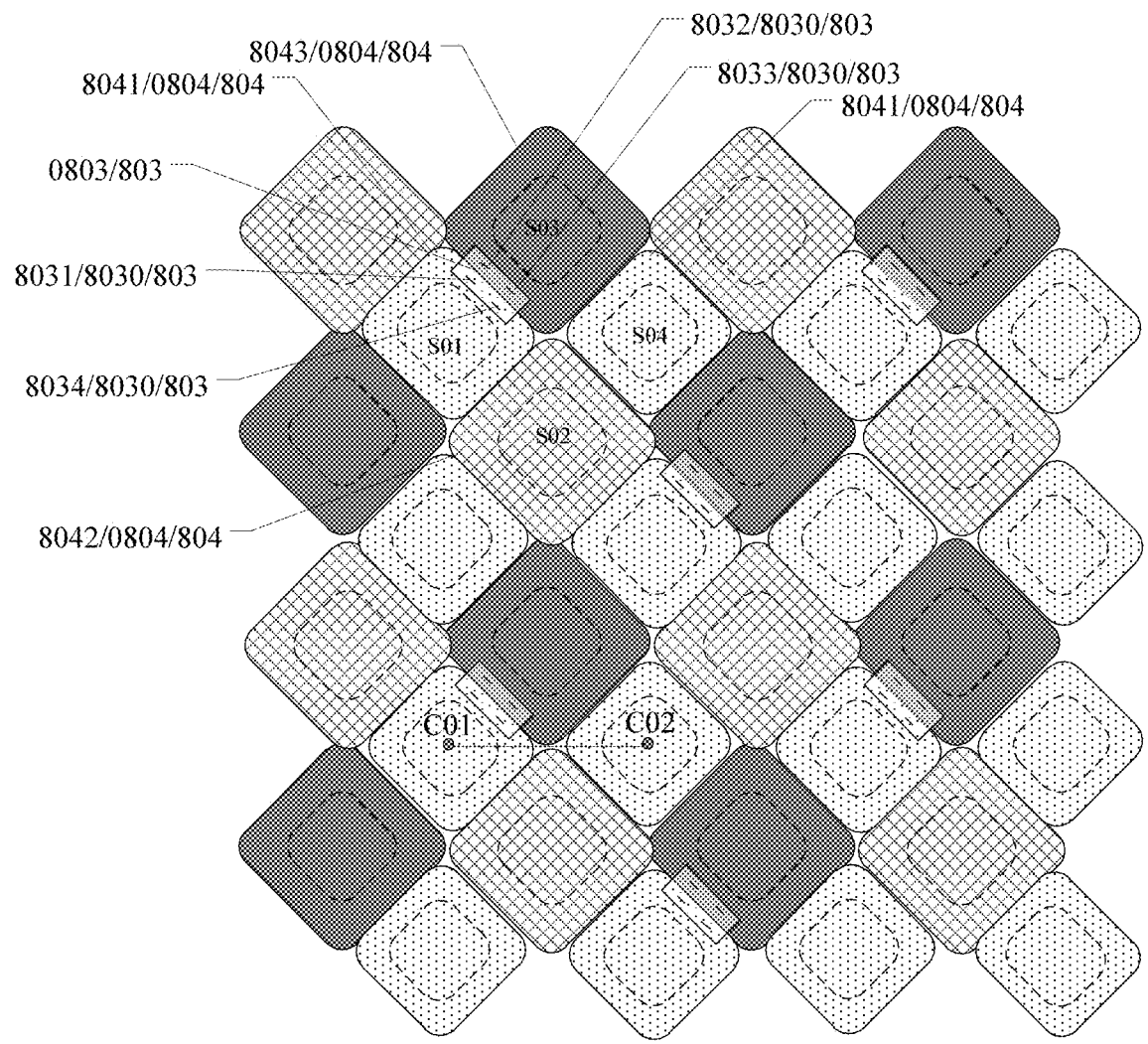
FIG. 8B is a schematic diagram of an array substrate provided by an embodiment of the present disclosure.

FIG. 8B is a schematic diagram of an array substrate provided by an embodiment of the present disclosure. The pixel arrangement of the array substrate in FIG. 8B is as same as the pixel arrangement of the array substrate in FIG. 8A. As compared with FIG. 8A, the PS 803 provided by the present embodiment is located between two first light-emitting functional portions 8041, and an extension direction of the PS 803 has an angle relative to an arrangement direction of the first sub-pixel S01 and the fourth sub-pixel S04. For example, the extension direction of the PS 803 has an angle relative to an arrangement direction of the two first light-emitting functional portions 8041. For example, the arrangement direction of the two first light-emitting functional portions 8041 is a horizontal direction, and an arrangement direction of the second light-emitting functional portion 8042 and the third light-emitting functional portion 8043 is a vertical direction. The plurality of protrusions 8030 include a first protrusion 8031, a second protrusion 8032, a third protrusion 8033 and a fourth protrusion 8034. The four protrusions are located on two opposite sides of the PS, and every side of the PS is provided with two protrusions along an extension direction of the side. In fabricating the two first light-emitting functional portions 8041, the second protrusion 8032 and the third protrusion 8033 are utilized to support a first FMM, so that an orthographic projection of a portion of a first ridged edge of the first FMM on the base substrate falls within an orthographic projection of the first recess 0803 on the base substrate. In fabricating the second light-emitting functional portion 8042, the second protrusion 8032 and the third protrusion 8033 are utilized to support a second FMM, so that an orthographic projection of a portion of a second ridged edge of the second FMM on the base substrate falls within the orthographic projection of the first recess 0803 on the base substrate. In fabricating the third light-emitting functional portion 8043, the first protrusion 8031 and the fourth protrusion 8034 are utilized to support a third FMM, so that an orthographic projection of a portion of a third ridged edge of the third FMM on the base substrate falls within the orthographic projection of the first recess 0803 on the base substrate. In FIG. 8B, the first protrusion 8031 and the fourth protrusion 8034 may be formed as one protrusion; and the second protrusion 8032 and the third protrusion 8033 may also be formed as one protrusion.

For example, as illustrated in FIG. 8B, orthographic projections of the first protrusion 8031 and the second protrusion 8032 on the base substrate fall within orthographic projections of the first light-emitting functional portion 8041 and the third light-emitting functional portion 8043 on the base substrate, respectively; and orthographic projections of the third protrusion 8033 and the fourth protrusion 8034 on the base substrate also fall within the orthographic projections of the first light-emitting functional portion 8041 and the third light-emitting functional portion 8043 on the base substrate, respectively.

As illustrated in FIG. 8A and FIG. 8B, the first light-emitting functional portion 8041, the second light-emitting functional portion 8042 and the third light-emitting functional portion 8043 belong to sub-pixels emitting light of different colors, respectively; the two first light-emitting functional portions 8041 belong to sub-pixels emitting light of the same color. As illustrated in FIG. 8A and FIG. 8B, the two first light-emitting functional portions 8041 are arranged sequentially; the second light-emitting functional portion 8042 and the third light-emitting functional portion 8043 are located at two sides of a connecting line of a center C01 and a center C02 of the two first light-emitting functional portions 8041, respectively; every two of the two first light-emitting functional portions 8041, the second light-emitting functional portion 8042 and the third light-emitting functional portion 8043 are adjacent to each other.

For example, the position of the PS in FIG. 8B may also be adjusted to be between the first light-emitting functional portion 8041 and the second light-emitting functional portion 8042. In this case, the second light-emitting functional portion 8042 and the third light-emitting functional portion 8043 in FIG. 8B may be interchanged, and reference may be made to FIG. 8B for related description, without repeatedly described herein.

For example, in some embodiments, as illustrated in FIG. 8B, the first protrusion 8031 and the second protrusion 8032 are parallel with each other; the third protrusion 8033 and the fourth protrusion 8034 are parallel with each other; and the first protrusion 8031 and the fourth protrusion 8034 are parallel with each other.

For example, as illustrated in FIG. 8B, two adjacent first light-emitting functional portions 8041, two adjacent second light-emitting functional portions 8042 and two adjacent third light-emitting functional portions 8043, as well as the PS 503 located between the first light-emitting functional portion 8041 and the second light-emitting functional portion 8042, may constitute one repetitive unit. Alternatively, two adjacent first light-emitting functional portions 8041, two adjacent second light-emitting functional portions 8042 and two adjacent third light-emitting functional portions 8043, as well as the PS 803 located between the first light-emitting functional portion 8041 and the third light-emitting functional portion 8043, may constitute one repetitive unit.

Figure 9A:
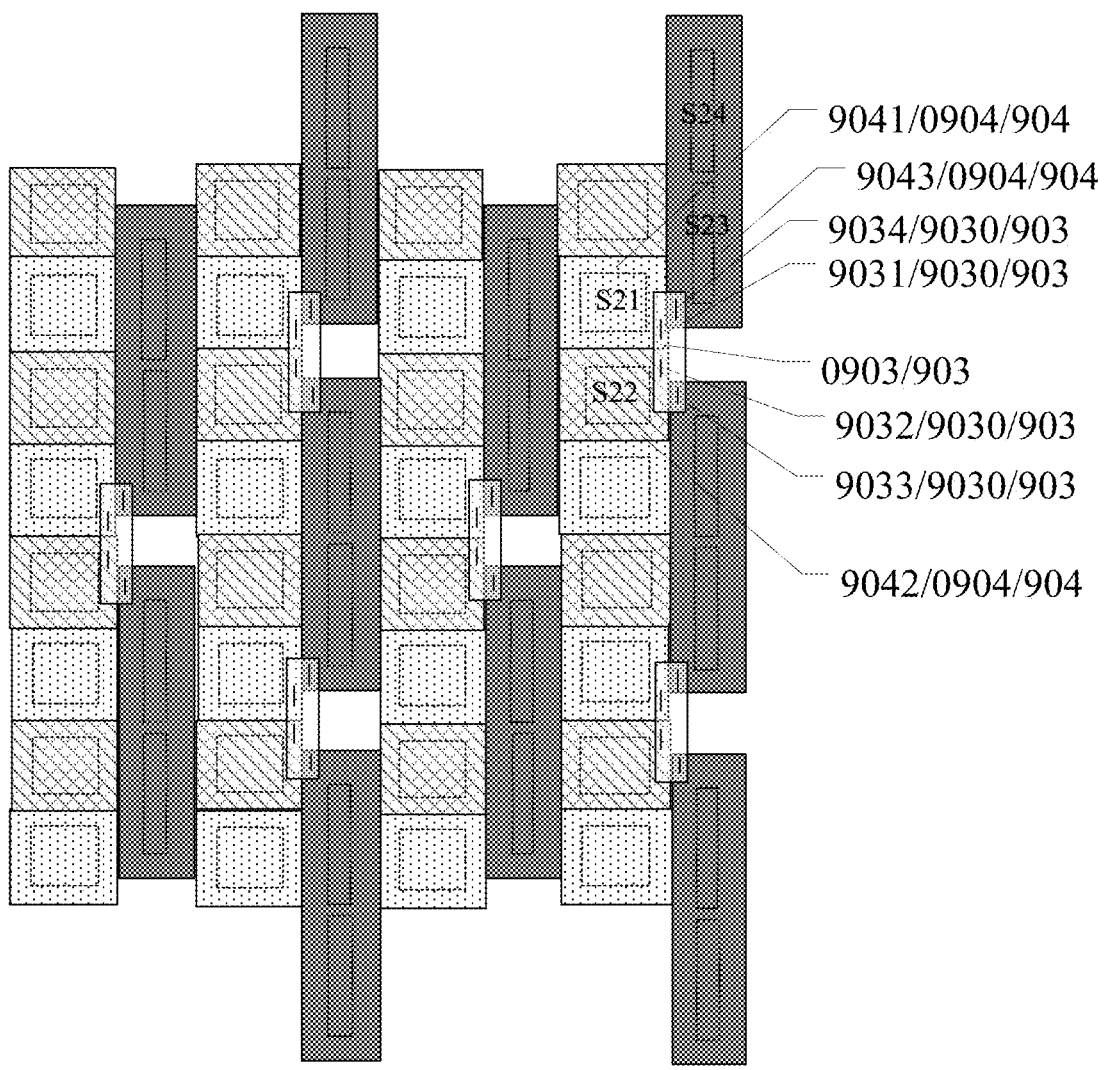
FIG. 9A is a schematic diagram of an array substrate provided by an embodiment of the present disclosure.

FIG. 9A is a schematic diagram of an array substrate provided by an embodiment of the present disclosure. As illustrated in FIG. 9A, the array substrate includes a light-emitting functional layer 904 and a PS 903. The light-emitting functional layer 904 includes a plurality of light-emitting functional portions 0904, the plurality of light-emitting functional portions 0904 include a first light-emitting functional portion 9041 and a second light-emitting functional portion 9042 adjacent to each other. The PS 903 is located between the first light-emitting functional portion 9041 and the second light-emitting functional portion 9042; the PS 903 includes a plurality of protrusions 9030 protruded in a direction away from the base substrate, and a first recess 0903 is located between adjacent protrusions 9030.

As illustrated in FIG. 9A, the plurality of protrusions 9030 include a first protrusion 9031 and a second protrusion 9032, and a first recess 0903 is provided between the first protrusion 9031 and the second protrusion 9032. In fabricating the first light-emitting functional portion 9041, the second protrusion 9032 is utilized to support a first FMM, so that an orthographic projection of a portion of a first ridged edge of the first FMM on the base substrate falls within an orthographic projection of the first recess 0903 on the base substrate. In fabricating the second light-emitting functional portion 9042, the first protrusion 9031 is utilized to support a second FMM, so that an orthographic projection of a portion of a second ridged edge of the second FMM on the base substrate falls within the orthographic projection of the first recess 0903 on the base substrate.

As illustrated in FIG. 9A, the plurality of light-emitting functional portions 0904 further include a third light-emitting functional portion 9043. For example, the first light-emitting functional portion 9041 and the second light-emitting functional portion 9042 are arranged in a vertical direction; two third light-emitting functional portions 9043 are located at the same side of the first light-emitting functional portion 9041 and the second light-emitting functional portion 9042 in a horizontal direction. For example, the two third light-emitting functional portions 9043 are in contact with the first light-emitting functional portion 9041 and the second light-emitting functional portion 9042, respectively. In fabricating the third light-emitting functional portion 9043, the first protrusion 9031 and the second protrusion 9032 are utilized to support a third FMM, so that an orthographic projection of a portion of a third ridged edge of the third FMM on the base substrate falls within the orthographic projection of the first recess 0903 on the base substrate.

As illustrated in FIG. 9A, the plurality of protrusions 903 may further include a third protrusion 9033 and a fourth protrusion 9034. A first recess 0903 is provided between every two of the first protrusion 9031, the second protrusion 9032, the third protrusion 9033 and the fourth protrusion 9034. As illustrated in FIG. 9A, the PS 903 has a strip shape, and a size of the first recess 0903 between the first protrusion 9031 and the second protrusion 9032 in an extension direction of the PS 903 is smaller than a size of the first recess 0903 between the third protrusion 9033 and the fourth protrusion 9034 in the extension direction of the PS 903. In fabricating the first light-emitting functional portion 9041, the second protrusion 9032, the third protrusion 9033 and the fourth protrusion 9034 are utilized to support the first FMM. In fabricating the second light-emitting functional portion 9042, the first protrusion 9031, the third protrusion 9033 and the fourth protrusion 9034 are utilized to support the second FMM. In fabricating the third light-emitting functional portion 9043, the first protrusion 9031 and the second protrusion 9032 are utilized to support the third FMM.

The closed, dashed box in FIG. 9A represents the opening of the PDL. The first light-emitting functional portion 9041 corresponds to one opening, corresponding to a first sub-pixel S21. The second light-emitting functional portion 9042 corresponds to one opening, corresponding to a second sub-pixel S22. Each of the third light-emitting functional portions 9043 corresponds to two openings, corresponding to a third sub-pixel S23 and a fourth sub-pixel S24. The third sub-pixel S23 and the fourth sub-pixel S24 are sub-pixels of the same color. For example, the first sub-pixel S21 is a green sub-pixel, the second sub-pixel S22 is a red sub-pixel, and the third sub-pixel S23 is a blue sub-pixel, without limited thereto.

As illustrated in FIG. 9A, the first light-emitting functional portion 9041, the second light-emitting functional portion 9042 and the third light-emitting functional portion 9043 belong to sub-pixels emitting light of different colors, respectively. The first light-emitting functional portion 9041 and the second light-emitting functional portion 9042 are arranged sequentially; two third light-emitting functional portions 9043 are located at the same side of the first light-emitting functional portion 9041 and the second light-emitting functional portion 9042 and are connected with the first light-emitting functional portion 9041 and the second light-emitting functional portion 9042, respectively. The PS 903 is located between the first light-emitting functional portion 9041 and the second light-emitting functional portion 9042, and is located between the two third light-emitting functional portions 9043.

The first protrusion 9031 in FIG. 9A is covered by the first light-emitting functional portion 9041. The second protrusion 9032 in FIG. 9A is covered by the second light-emitting functional portion 9042. Each of the third protrusion 9033 and the fourth protrusion 9034 in FIG. 9A is covered by one of the third light-emitting functional portions 9043.

In FIG. 9A, each of the protrusions 9030 extends along an extension direction of the PS 903, without limited thereto. For example, each of the protrusions 9030 in FIG. 9A extends along a vertical direction. For example, in some other embodiments, each of the protrusions 9030 in FIG. 9A may be adjusted to extend along a direction perpendicular to the extension direction of the PS 903, for example, extending along a horizontal direction.

For example, as illustrated in FIG. 9A, an orthographic projection of the first protrusion 9031 on the base substrate falls within an orthographic projection of the first light-emitting functional portion 9041 on the base substrate; an orthographic projection of the second protrusion 9032 on the base substrate 201 falls within an orthographic projection of the second light-emitting functional portion 9042 on the base substrate; and an orthographic projection of the third protrusion 9033 on the base substrate fall within orthographic projections of the two third light-emitting functional portions 9043 adjacent to each other on the base substrate.

Figure 9B:
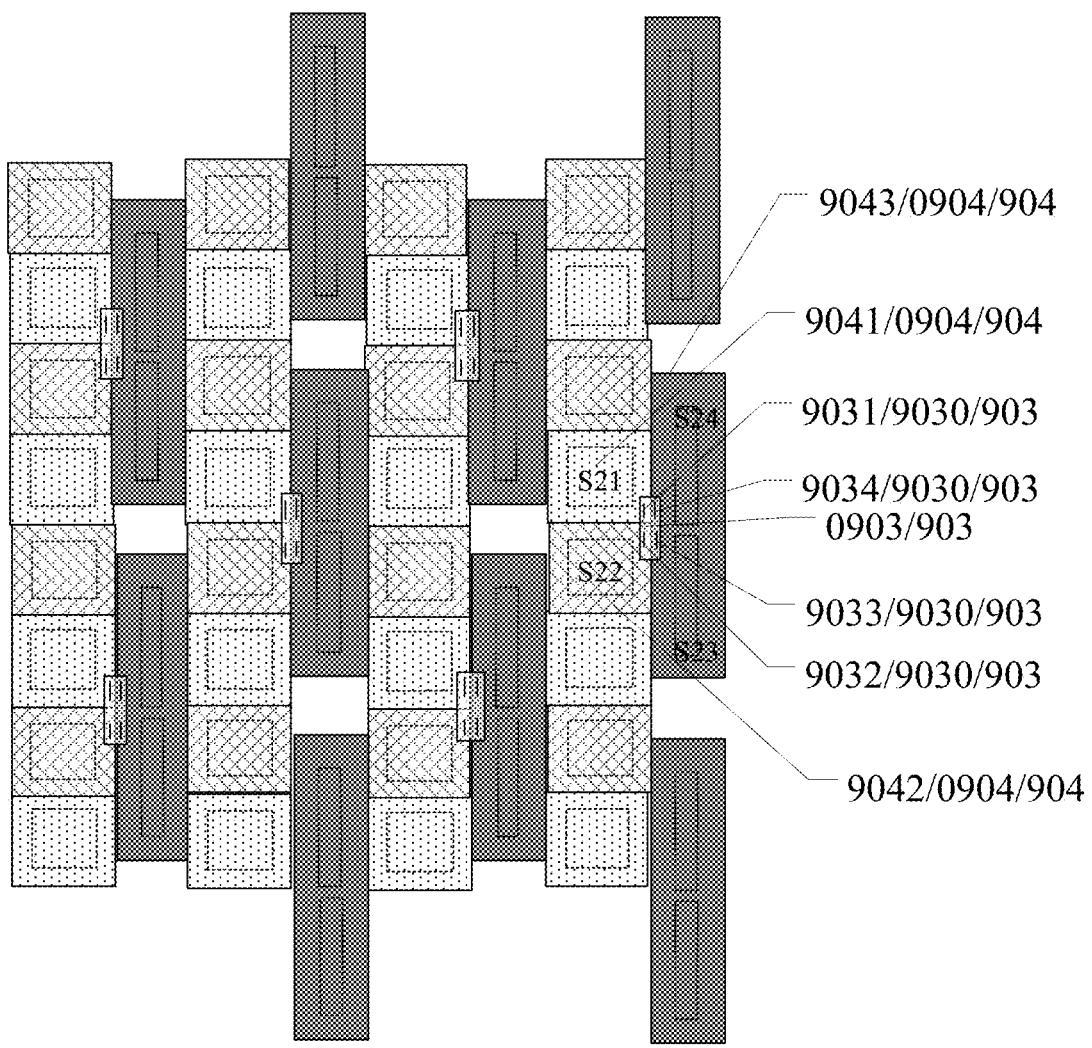
FIG. 9B is a schematic diagram of an array substrate provided by another embodiment of the present disclosure.

FIG. 9B is a schematic diagram of an array substrate provided by another embodiment of the present disclosure. As compared with FIG. 9A, the position of the PS 903 is adjusted so that the PS 903 is located between the first light-emitting functional portion 9041, the second light-emitting functional portion 9042 and the third light-emitting functional portion 9043. In FIG. 9B, every two of the first light-emitting functional portion 9041 and the second light-emitting functional portion 9042 are adjacent to each other. The first light-emitting functional portion 9041 and the second light-emitting functional portion 9042 are arranged sequentially; two third light-emitting functional portions 9043 are located at the same side of the first light-emitting functional portion 9041 and the second light-emitting functional portion 9042 and are connected with the first light-emitting functional portion 9041 and the second light-emitting functional portion 9042, respectively. For example, in FIG. 9B, the PS 903 has a strip shape, and a size of a first recess 0903 between the first protrusion 9031 and the second protrusion 9042 in an extension direction of the PS 903 is equal to a size of a first recess 0903 between the third protrusion 9033 and the fourth protrusion 9034 in the extension direction of the PS 903, without limited thereto.

As illustrated in FIG. 9A and FIG. 9B, the pixel arrangement in FIG. 9A is as same as that in FIG. 9B. For example, in odd-numbered columns, a plurality of first sub-pixels S21 are arranged alternately with a plurality of second sub-pixels S22. In the row direction, one first sub-pixel S21 and one second sub-pixel S22 adjacent to each other correspond to one third sub-pixel S23. Alternatively, in the row direction, one first sub-pixel S21 and one second sub-pixel S22 adjacent to each other correspond to one fourth sub-pixel S24. The third sub-pixel S23 and the fourth sub-pixel S24 are sub-pixels of the same color.

For example, as illustrated in FIG. 9B, an orthographic projection of the first protrusion 9031 on the base substrate falls within an orthographic projection of the first light-emitting functional portion 9041 on the base substrate; an orthographic projection of the second protrusion 9032 on the base substrate 201 falls within an orthographic projection of the second light-emitting functional portion 9042 on the base substrate; and an orthographic projection of the third protrusion 9033 on the base substrate falls within an orthographic projection of the third light-emitting functional portions 9043 on the base substrate.

For example, in some embodiments, as illustrated in FIG. 9A and FIG. 9B, the first protrusion 9031 and the second protrusion 9032 are parallel with each other; the third protrusion 9033 and the fourth protrusion 9034 are parallel with each other; the first protrusion 9031 and the fourth protrusion 9034 are parallel with each other. That is, as illustrated in FIG. 9A and FIG. 9B, every two of the first protrusion 9031, the second protrusion 9032, the third protrusion 9033 and the fourth protrusion 9034 are parallel with each other.

Figure 10A:
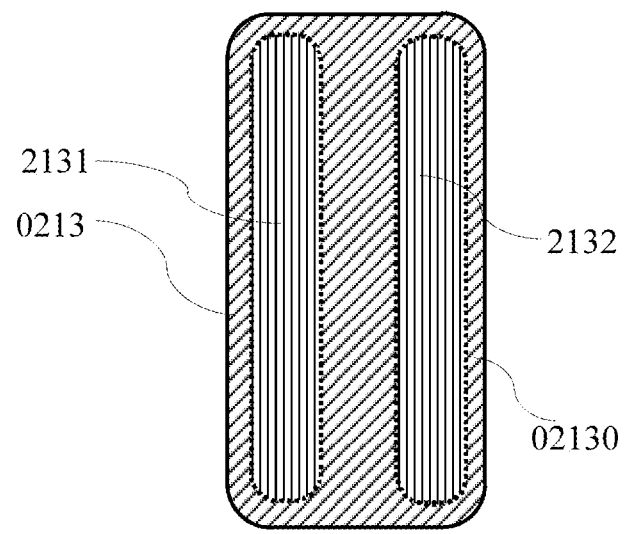
FIG. 10A-FIG. 10C are top views of a photo spacer (PS) in an array substrate provided by an embodiment of the present disclosure.
Figure 10B:
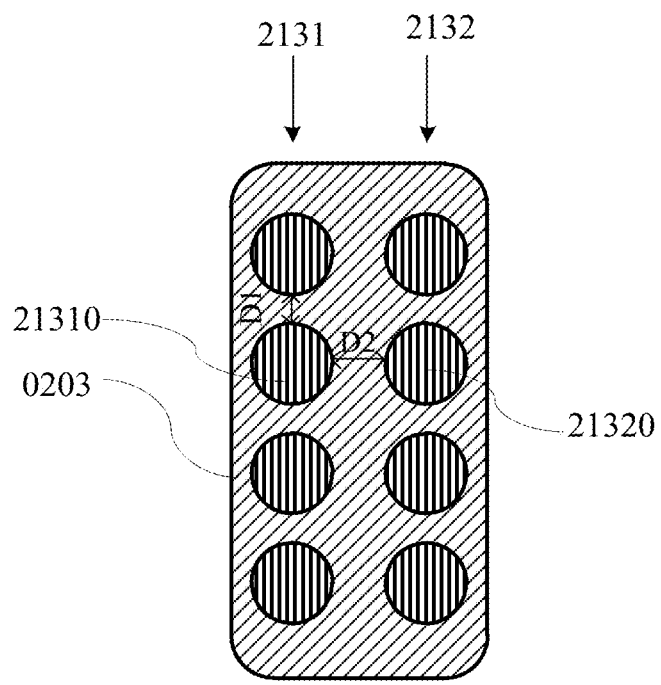
Figure 10C:
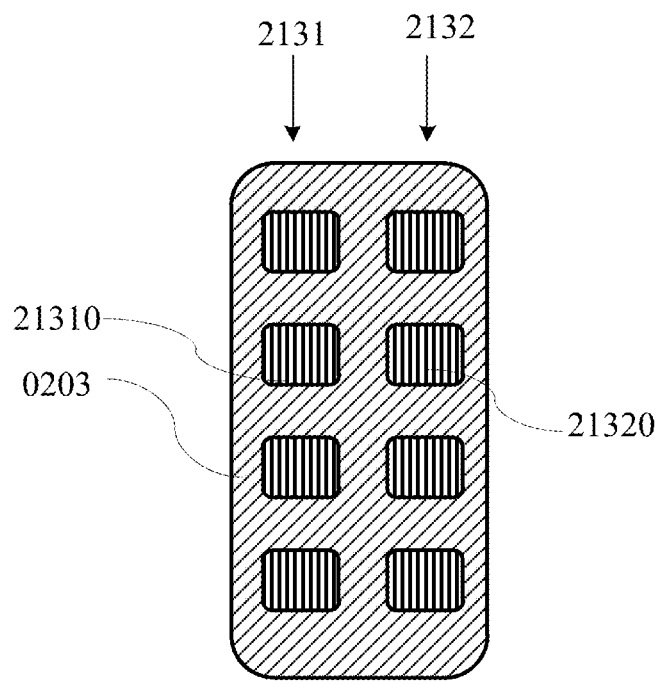

FIG. 10A-FIG. 10C are top views of a PS in an array substrate provided by an embodiment of the present disclosure. The PS in FIG. 10A includes a base portion 0213 and two strip-shaped protrusions located thereon, that is, a first protrusion 2131 and a second protrusion 2132, and a first recess is further provided between the first protrusion 2131 and the second protrusion 2132. FIG. 10A illustrates an edge part 02130 of the base portion 0213. In FIG. 10B, the first protrusion 2131 includes four sub-protrusions 21310, the second protrusion 2132 includes four sub-protrusions 21320, a second recess is provided between adjacent sub-protrusions 21310 or adjacent sub-protrusions 21320, a size D1 of an orthographic projection of the second recess on the base substrate is smaller than a size D2 of the first recess on the base substrate. The orthographic projection of the sub-protrusion on the base substrate in FIG. 10B has a round shape, and the orthographic projection of the sub-protrusion on the base substrate in FIG. 10C has a rectangle shape.

In the embodiment of the present disclosure, in fabricating a light-emitting functional portion, part of the protrusions away from this light-emitting functional portion may be utilized to support the FMM, so that the protrusions close to this light-emitting functional portion are left unused without supporting the FMM, which results in that an orthographic projection of a portion of a ridged edge of the FMM on the base substrate falls within an orthographic projection of the first recess between adjacent protrusions on the base substrate.

In the embodiment of the present disclosure, an extension direction of the protrusion or the first recess may be consistent with an extension direction of a boundary of the light-emitting functional portion, without limited thereto. In some embodiments, the extension direction of the protrusion or the first recess may be intersected with the extension direction of the boundary of the light-emitting functional portion. Further, for example, the extension direction of the protrusion or the first recess may be perpendicular to the extension direction of the boundary of the light-emitting functional portion.

In the embodiment of the present disclosure, the PS may have a shape of strip, triangle and the like in a top view, without limited thereto. In an actual process, the PS as fabricated may have an approximately oval shape or a round shape.

At least one embodiment of the present disclosure further provides a display device, including any of the array substrates described above.

At least one embodiment of the present disclosure further provides a manufacturing method of an array substrate, including: forming a photo spacer (PS) on a base substrate, the PS including a plurality of protrusions protruded in a direction away from the base substrate and a first recess located between adjacent protrusions; and aligning the base substrate with a first fine metal mask (FMM), and forming a first light-emitting functional portion on the base substrate by using an evaporation process. The first FMM includes a first rib and a first through hole enclosed by a first side surface of the first rib; and in forming the first light-emitting functional portion, an orthographic projection of a portion of a first ridged edge on the base substrate falls within an orthographic projection of the first recess on the base substrate, the first ridged edge is formed by the first side surface intersecting with a first surface of the first rib which contacts the PS.

Figure 11A:
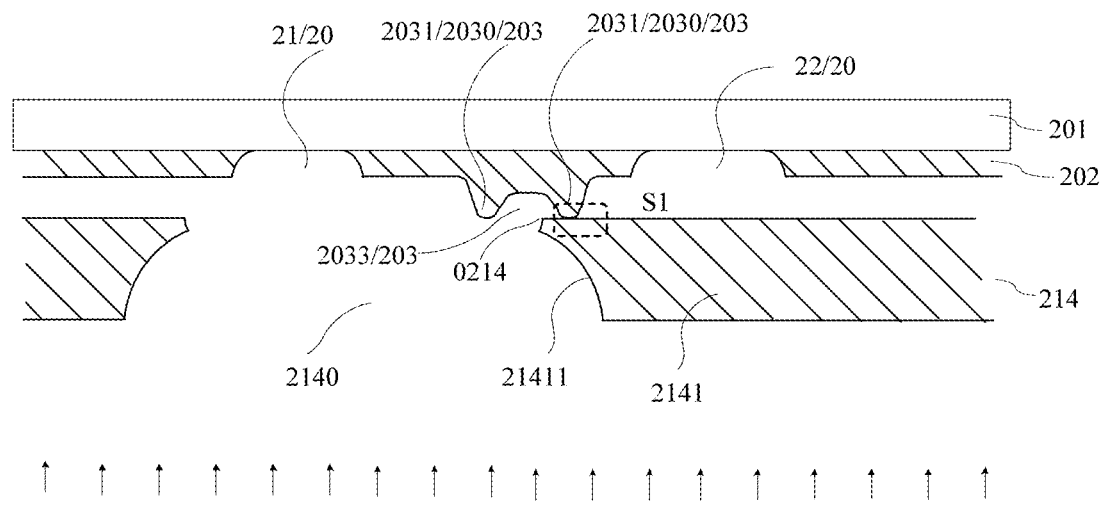
FIG. 11A is a schematic diagram of fabricating a first light-emitting functional portion by using a first FMM in a manufacturing method of an array substrate provided by an embodiment of the present disclosure.
Figure 11B:
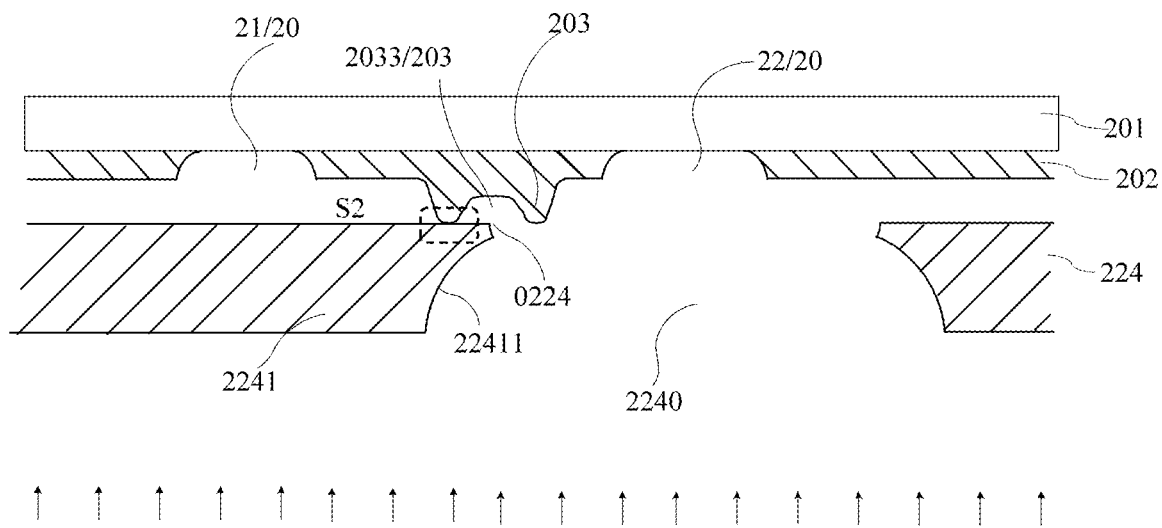
FIG. 11B is a schematic diagram of fabricating a second light-emitting functional portion by using a second FMM in a manufacturing method of an array substrate provided by an embodiment of the present disclosure.

FIG. 11A is a schematic diagram of fabricating a first light-emitting functional portion by using a first FMM in a manufacturing method of an array substrate provided by an embodiment of the present disclosure. FIG. 11B is a schematic diagram of fabricating a second light-emitting functional portion by using a second FMM in a manufacturing method of an array substrate provided by an embodiment of the present disclosure. By utilizing the method in FIG. 11A and FIG. 11B, a first light-emitting functional portion and a second light-emitting functional portion in the array substrate illustrated in FIG. 2A may be formed, respectively, without limited thereto.

As illustrated in FIG. 11A, the first FMM 214 includes a first rib 2141 and a first through hole 2140 enclosed by a first side surface 21411 of the first rib 2141. The first FMM 214 is located at a side of the base substrate 201 where the PS 203 is provided, and an evaporation source is located at a side of the first FMM 214 away from the base substrate 201. The arrow in FIG. 11A represents a flow direction of the evaporated air.

For example, in fabricating the first light-emitting functional portion, one of the adjacent protrusions is in contact with the first rib and the other one is not in contact with the first rib. As illustrated in FIG. 11A, the first protrusion 2031 is not in contact with the first rib 2141, while the second protrusion 2032 is in contact with the first rib 2141. An orthographic projection of a first ridged edge 0214 on the base substrate 201 falls within an orthographic projection of the first recess 2033 on the base substrate 201, wherein the first ridged edge 0214 is formed by the first side surface 21411 intersecting with a first surface S1 of the first rib 2141 which contacts the PS. For example, an orthographic projection of a portion of the first side surface 21411 close to the first ridged edge 0214 on the base substrate 201 falls within the orthographic projection of the first recess 2033 on the base substrate 201.

For example, as illustrated in FIG. 11B, the manufacturing method further includes: forming a second light-emitting functional portion on the base substrate by using an evaporation process. Forming the second light-emitting functional portion includes: aligning the base substrate 201 with a second FMM 224; the second FMM 224 includes a second rib 2241 and a second through hole 2240 enclosed by a second side surface 22411 of the second rib 2241. In forming the second light-emitting functional portion, an orthographic projection of a portion of a second ridged edge 0224 on the base substrate 201 falls within an orthographic projection of the first recess 2033 on the base substrate 201, the second ridged edge 0224 is formed by the second side surface 22411 intersecting with a second surface S2 of the second rib 2241 which contacts the PS. In forming the first light-emitting functional portion, one of the adjacent protrusions supports the first rib of the first FMM; and in forming the second light-emitting functional portion, the other one of the adjacent protrusions supports the second rib of the second FMM. An orthographic projection of the second ridged edge 0224 on the base substrate 201 falls within the orthographic projection of the first recess 2033 on the base substrate 201, the second ridged edge 0224 is formed by the second side surface 22411 intersecting with the second surface S2 of the second rib 2241 which contacts the PS. For example, an orthographic projection of a portion of the second side surface 22411 close to the second ridged edge 0224 on the base substrate 201 falls within the orthographic projection of the first recess 2033 on the base substrate 201.

Of course, in some embodiments, in forming the first light-emitting functional portion, one of the adjacent protrusions is utilized to support the first FMM; and in forming the second light-emitting functional portion, the same one protrusion is still utilized to support the second FMM, as illustrated in FIG. 9A and FIG. 9B.

For example, in the embodiment of the present disclosure, the first side surface 21411 of the first rib 2141 is a surface of the first rib 2141 enclosing the first through hole 2140. For example, in the embodiment of the present disclosure, the second side surface 22411 of the second rib 2241 includes a surface of the second rib 2241 enclosing the second through hole 2240.

Figure 12:
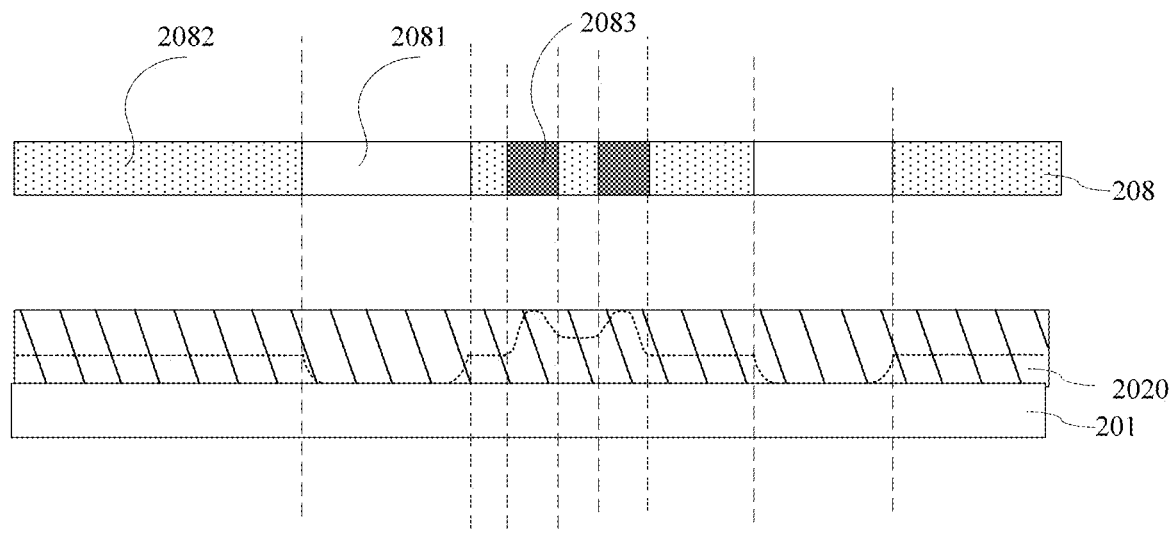
FIG. 12 is a schematic diagram of forming a PDL and a PS, simultaneously, in a manufacturing method of an array substrate provided by an embodiment of the present disclosure.

FIG. 12 is a schematic diagram of forming a PDL and a PS, simultaneously, in a manufacturing method of an array substrate provided by an embodiment of the present disclosure. For example, before forming the PS, the method further includes: forming a PDL 202 (referring to FIG. 11A and FIG. 11B) on the base substrate 201. The PDL 202 has a plurality of openings. Forming the PDL 202 and forming the PS 203 includes: forming a first film 2020 on the base substrate 201; and exposing and developing the first film 2020 by using a multi-tone mask as a mask 208 to form the PDL 202, the PS 203 and the plurality of openings 20 simultaneously. As illustrated in FIG. 12, the mask 208 includes a light-transmittance portion 2081, a semi-transmittance portion 2082 and a non-transmittance portion 2083. The light-transmittance portion 2081 corresponds to a position of the first film 2020 where the opening is to be formed, the non-transmittance portion 2083 corresponds to a position of the first film 2020 where the protrusion is to be formed, and the semi-transmittance portion 2082 corresponds to the remaining position of the first film 2020. The dashed line located in the first film 2020 in FIG. 12 represents a profile of the PDL and the PS integrally formed as an integral structure upon exposing and developing the first film 2020.

In the embodiment of the present disclosure, a process of forming the PDL and the PS that have an integral structure in the array substrate illustrated in FIG. 2A will be described by way of example. The process corresponding to PDL and PS having other structures may be designed according to the structure thereof.

Figure 13A:
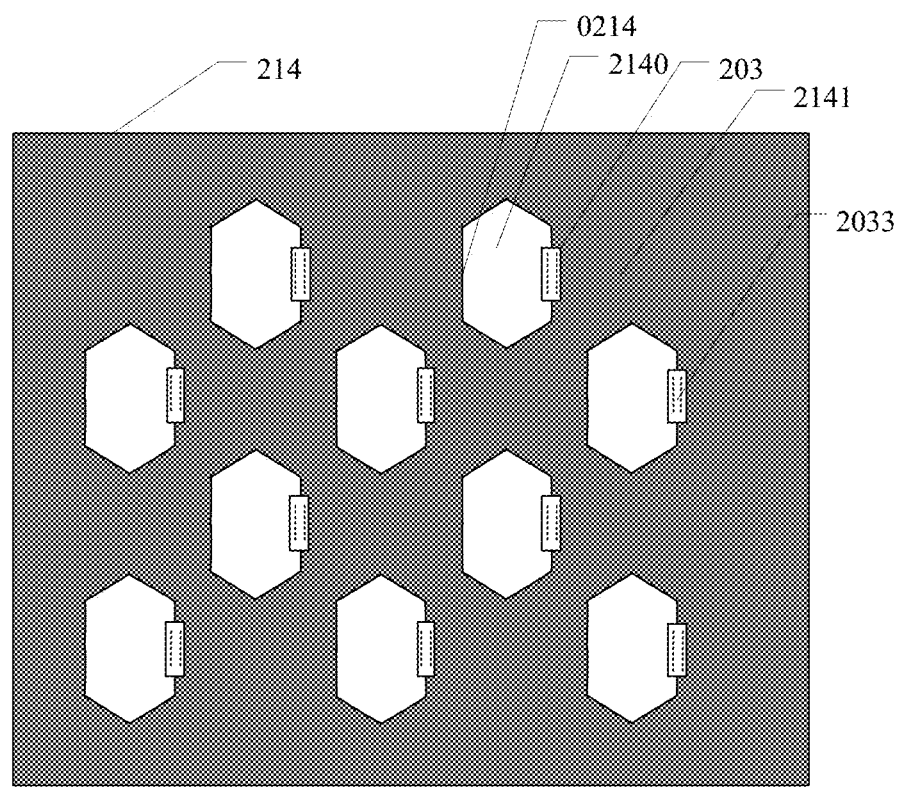
FIG. 13A is a schematic diagram of a first FMM for forming a first light-emitting functional portion and a PS for supporting the first FMM in a manufacturing method of an array substrate provided by an embodiment of the present disclosure.
Figure 13B:
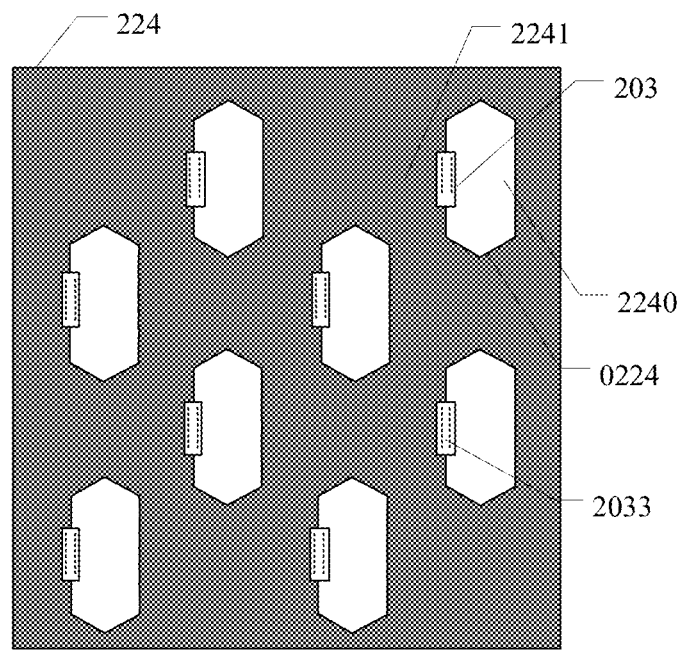
FIG. 13B is a schematic diagram of a second FMM for forming a second light-emitting functional portion and a PS for supporting the second FMM in a manufacturing method of an array substrate provided by an embodiment of the present disclosure.
Figure 13C:
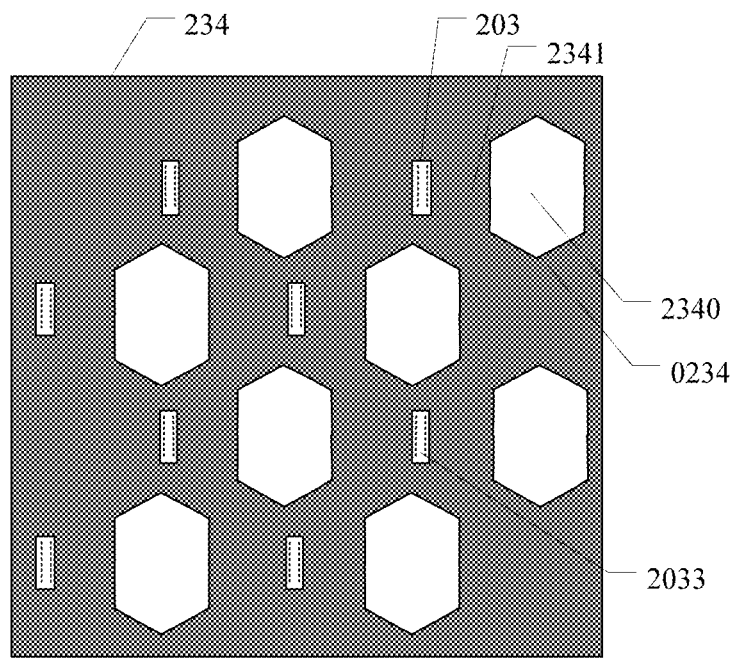
FIG. 13C is a schematic diagram of a third FMM for forming a third light-emitting functional portion and a PS for supporting the third FMM in a manufacturing method of an array substrate provided by an embodiment of the present disclosure.

FIG. 13A is a schematic diagram of a first FMM for forming a first light-emitting functional portion and a PS for supporting the first FMM in a manufacturing method of an array substrate provided by an embodiment of the present disclosure. FIG. 13B is a schematic diagram of a second FMM for forming a second light-emitting functional portion and a PS for supporting the second FMM in a manufacturing method of an array substrate provided by an embodiment of the present disclosure. FIG. 13C is a schematic diagram of a third FMM for forming a third light-emitting functional portion and a PS for supporting the third FMM in a manufacturing method of an array substrate provided by an embodiment of the present disclosure. By utilizing the FMMs illustrated in FIG. 13A-FIG. 13C, an array substrate as illustrated in FIG. 4 may be formed. FIG. 13A illustrates a PS 203, a first FMM 214, a first rib 2141, a first ridged edge 0214 and a first through hole 2140. FIG. 13B illustrates a PS 203, a second FMM 224, a second rib 2241, a second ridged edge 0224 and a second through hole 2240. FIG. 13C illustrates a PS 203, a third FMM 234, a third rib 2341, a third ridged edge 0234 and a third through hole 2340.

In the embodiment of the present disclosure, a method of forming the array substrate as illustrated in FIG. 2A is described by way of example, and the manufacturing method of the array substrate provided by other embodiments may refer to the described method.

For example, in the embodiment of the present disclosure, as illustrated in FIG. 13A-FIG. 13C, a boundary of FMM that encloses a through hole may be a ridged edge of the rib. That is, as illustrated in FIG. 13A, the boundary of the first rib 2141 that encloses the first through hole 2140 may be the first ridged edge 0214; as illustrated in FIG. 13B, the boundary of the second rib 2241 that encloses the second through hole 2240 may be the second ridged edge 0224; as illustrated in FIG. 13C, the boundary of the third rib 2341 that encloses the third through hole 2340 may be the third ridged edge 0234, without limited thereto.

For example, in the embodiment of the present disclosure, a boundary of each of the light-emitting functional portions may correspond to a position of a ridged edge of an FMM for forming the light-emitting functional portion, without limited thereto.

In some embodiments, as illustrated in FIG. 5, FIG. 6, FIG. 7B and FIG. 8A, every two of the first light-emitting functional portion, the second light-emitting functional portion and third light-emitting functional portion are adjacent to each other; at least parts of boundaries of the two adjacent light-emitting functional portions are located in the same first recess, or, at least parts of boundaries of the two adjacent light-emitting functional portions are connected in the same first recess; and a region covered by each of the light-emitting functional portions includes at least one protrusion, without limited thereto. For example, both the amount and the area of the protrusions in regions covered by different light-emitting functional portions are the same for the different light-emitting functional portions; for example, two adjacent protrusions are symmetrical about a center of the first recess between the two protrusions; for another example, protrusions in a region covered by two adjacent light-emitting functional portions may be symmetrical about a center of the same first recess in which the boundaries of the two light-emitting functional portions are located.

In some embodiments, as illustrated in FIG. 3, FIG. 4, FIG. 7A, FIG. 8B, FIG. 9A and FIG. 9B, the region covered by part of the light-emitting functional portions includes at least one protrusion. As illustrated in FIG. 3, FIG. 4 and FIG. 7A, the region covered by the third light-emitting functional portion includes no protrusion. As illustrated in FIG. 8B, the region covered by the second light-emitting functional portion includes no protrusion. As illustrated in FIG. 9A and FIG. 9B, regions covered by some of the first light-emitting functional portions and some of the second light-emitting functional portions include no protrusion.

In the drawings accompanying the embodiments of the present disclosure, for purpose of better understanding, the photo spacer in part of the drawings is illustrated in a semi-transparent state.

What have been described above are only specific implementations of the present disclosure, but the protection scope of the present disclosure is not limited thereto. Any variations or substitutions conceivable for one skilled in the art who is familiar with the present technical field should fall within the protection scope of the present disclosure. Therefore, the protection scope of the present disclosure should be based on the protection scope of the claims.

What is claimed is:

1. An array substrate, comprising:
a base substrate;
a light-emitting functional layer, the light-emitting functional layer comprising a plurality of light-emitting functional portions, the plurality of light-emitting functional portions comprising a first light-emitting functional portion and a second light-emitting functional portion adjacent to each other; and
a photo spacer (PS), the PS being located between the first light-emitting functional portion and the second light-emitting functional portion, the PS comprising a plurality of protrusions protruded in a direction away from the base substrate and a first recess located between adjacent protrusions,
wherein a first protrusion of the plurality of protrusions has a first sidewall partially defining the first recess, a second sidewall opposite to the first sidewall in a direction parallel to the base substrate, and a top surface away from the base substrate and connecting the first sidewall and the second sidewall, and an edge part of the first light-emitting functional portion continuously extends from a position covering the second sidewall of the first protrusion to positions covering the top surface and the first sidewall of the first protrusion,
wherein the PS has a strip shape, the PS comprises four protrusions, the four protrusions are located on two sides of the PS, respectively, the two sides of the PS are opposite to each other, and each of the two sides of the PS is provided with two protrusions arranged along an extension direction of the side;
wherein the light-emitting functional layer further comprises two third light-emitting functional portions; and the first light-emitting functional portion, the second light-emitting functional portion and the third light-emitting functional portion belong to sub-pixels emitting light of different colors, respectively; the first light-emitting functional portion and the second light-emitting functional portion are arranged sequentially; the two third light-emitting functional portions are located at a same side of the first light-emitting functional portion and the second light-emitting functional portion and are connected with the first light-emitting functional portion and the second light-emitting functional portion, respectively; the PS is located between the first light-emitting functional portion and the second light-emitting functional portion, between the first light-emitting functional portion and one of the two third light-emitting functional portions, and between the second light-emitting functional portion and the other one of the two third light-emitting functional portions; and
wherein the four protrusions comprise the first protrusion, a second protrusion, a third protrusion and a fourth protrusion; and the first recess is provided between every two protrusions of the first protrusion, the second protrusion, the third protrusion and the fourth protrusion; an orthographic projection of the first protrusion and an orthographic projection of the second protrusion on the base substrate fall within an orthographic projection of the first light-emitting functional portion and an orthographic projection of the second light-emitting functional portion on the base substrate, respectively; an orthographic projection of the third protrusion and an orthographic projection of the fourth protrusion on the base substrate fall within orthographic projections of the two third light-emitting functional portions on the base substrate, respectively; a size of the first recess between the first protrusion and the second protrusion along an extension direction of the PS is smaller than a size of the first recess between the third protrusion and the fourth protrusion along the extension direction of the PS.

2. The array substrate according to claim 1, wherein an edge part of the second light-emitting functional portion continuously extends on opposite sidewalls and a top surface of the second protrusion.

3. The array substrate according to claim 2, wherein an orthographic projection of an interface between the edge parts of the first light-emitting functional portion and the second light-emitting functional portion on the base substrate falls within an orthographic projection of the first recess on the base substrate.

4. The array substrate according to claim 1, wherein the PS further comprises a base portion, the plurality of protrusions are located at a side of the base portion away from the base substrate, and the plurality of protrusions and the base portion are formed as an integral structure.

5. The array substrate according to claim 1, wherein each of the plurality of protrusions comprises a plurality of sub-protrusions, a second recess is provided between adjacent sub-protrusions, and a size of the second recess in a direction parallel with the base substrate is smaller than or equal to a size of the first recess in the direction parallel with the base substrate.

6. The array substrate according to claim 1, wherein the first light-emitting functional portion, the second light-emitting functional portion and the third light-emitting functional portion belong to sub-pixels emitting light of different colors, respectively.

7. The array substrate according to claim 1, wherein at least parts of boundaries of two adjacent light-emitting functional portions are located in a same first recess; or, at least parts of boundaries of two adjacent light-emitting functional portions are connected in a same first recess, and a region covered by each of the light-emitting functional portions includes at least one protrusion.

8. The array substrate according to claim 1, comprising a plurality of PSs, wherein a distance between adjacent PSs is greater than a maximum size of the first recess in a direction parallel with the base substrate.

9. The array substrate according to claim 1, wherein a maximum size of the first recess in a direction parallel with the base substrate is greater than or equal to a maximum size of the first recess in a direction perpendicular to the base substrate.

10. A display device, comprising the array substrate according to claim 1.

11. A manufacturing method of an array substrate, comprising:
forming a photo spacer (PS) on a base substrate, the PS comprising a plurality of protrusions protruded in a direction away from the base substrate and a first recess located between adjacent protrusions; and aligning the base substrate with a first fine metal mask (FMM), and forming a first light-emitting functional portion on the base substrate by using an evaporation process, wherein the first FMM comprises a first rib and a first through hole enclosed by a first side surface of the first rib, and the first rib has a first surface and a first ridged edge, the first surface of the first rib contacts the PS during the evaporation process, and the first ridged edge is located between and connects the first side surface and the first surface; and in forming the first light-emitting functional portion, an orthographic projection of a portion of a first ridged edge of the first rib on the base substrate falls within an orthographic projection of the first recess on the base substrate.

12. The manufacturing method according to claim 11, wherein one of the adjacent protrusions contacts the first rib, and the other one of the adjacent protrusions has no contact with the first rib.

13. The manufacturing method according to claim 11, further comprising: forming a second light-emitting functional portion on the base substrate by using an evaporation process, wherein forming the second light-emitting functional portion comprises: aligning the base substrate with a second FMM, wherein the second FMM comprises a second rib and a second through hole enclosed by a second side surface of the second rib, and the second rib has a second surface and a second ridged edge, the second surface of the second rib contacts the PS during the evaporation process, and the second ridged edge is located between and connects the second side surface and the second surface; in forming the second light-emitting functional portion, an orthographic projection of a portion of a second ridged edge of the second rib on the base substrate falls within the orthographic projection of the first recess on the base substrate;

in forming the first light-emitting functional portion, one of the adjacent protrusions supports the first rib of the first FMM; and in forming the second light-emitting functional portion, the other one of the adjacent protrusions supports the second rib of the second FMM.

14. The manufacturing method according to claim 13, wherein the PS has a strip shape, the PS comprises four protrusions, the four protrusions are located on two sides of the PS, respectively, the two sides of the PS are opposite to each other, and each of the two sides of the PS is provided with two protrusions arranged along an extension direction of the side; or the four protrusions are located on four sides of the PS, respectively, and each of the four sides of the PS is provided with one protrusion arranged along an extension direction of the side.

15. The manufacturing method according to claim 14, further comprising: forming a third light-emitting functional portion by an evaporation process; wherein the first light-emitting functional portion, the second light-emitting functional portion and the third light-emitting functional portion belong to sub-pixels emitting light of different colors, respectively;

a light-emitting functional layer is provided with two first light-emitting functional portions, the two first light-emitting functional portions are arranged sequentially; the second light-emitting functional portion and the third light-emitting functional portion are located at two sides of a connecting line of centers of the two first light-emitting functional portions, respectively; every two of the two first light-emitting functional portions, the second light-emitting functional portion, and the third light-emitting functional portion are adjacent to each other;

the PS is located between the two first light-emitting functional portions, and is located between the second light-emitting functional portion and the third light-emitting functional portion; or, the PS is located between the first light-emitting functional portion and the third light-emitting functional portion or located between the first light-emitting functional portion and the second light-emitting functional portion.

16. The array substrate according to claim 14, further comprising: forming a third light-emitting functional portion by an evaporation process; wherein the first light-emitting functional portion, the second light-emitting functional portion and the third light-emitting functional portion belong to sub-pixels emitting light of different colors, respectively;

every two of the first light-emitting functional portion, the second light-emitting functional portion and the third light-emitting functional portion are adjacent to each other; the first light-emitting functional portion and the second light-emitting functional portion are arranged sequentially; the third light-emitting functional portion is located at a same side of the first light-emitting functional portion and the second light-emitting functional portion and is connected with the first light-emitting functional portion and the second light-emitting functional portion, respectively;

the PS is located between the first light-emitting functional portion and the second light-emitting functional portion, between the first light-emitting functional portion and the third light-emitting functional portion, and between the second light-emitting functional portion and the third light-emitting functional portion.

17. The manufacturing method according to claim 11, wherein the PS comprises three protrusions, the three protrusions are located on three edges of a triangle, respectively, and the first recess is provided between every two protrusions of the three protrusions.

* * * * *